(12) United States Patent
Leigh et al.

(10) Patent No.: US 10,524,379 B2
(45) Date of Patent: Dec. 31, 2019

(54) COMPUTER NETWORKING INTERCONNECTORS

(71) Applicant: HEWLETT PACKARD ENTERPRISE DEVELOPMENT LP, Houston, TX (US)

(72) Inventors: Kevin Leigh, Houston, TX (US); John Robert Grady, Houston, TX (US); George David Megason, Fort Collins, CO (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 16/224,725

(22) Filed: Dec. 18, 2018

(65) Prior Publication Data

US 2019/0124784 A1  Apr. 25, 2019

Related U.S. Application Data

(62) Division of application No. 15/614,337, filed on Jun. 5, 2017, now Pat. No. 10,188,012.

(51) Int. Cl.
*H05K 7/20* (2006.01)
*H05K 7/14* (2006.01)
(Continued)

(52) U.S. Cl.
CPC .......... *H05K 7/1489* (2013.01); *H01R 13/72* (2013.01); *H01R 25/006* (2013.01); *H04Q 1/06* (2013.01); *H05K 7/1492* (2013.01)

(58) Field of Classification Search
CPC ... G02B 6/4452; G02B 6/4459; G02B 6/4463
(Continued)

(56) References Cited

U.S. PATENT DOCUMENTS 5,216,579 A  6/1993  Basara
5,647,763 A * 7/1997  Arnold ................. G02B 6/3897
                                                    439/532
(Continued)

FOREIGN PATENT DOCUMENTS

WO   WO-2016053323   4/2016

OTHER PUBLICATIONS

EPO, Extended European Search Report, dated Sep. 25, 2018, Application No. 18173623.2, 6 pages.

*Primary Examiner* — Anthony Q Edwards
(74) *Attorney, Agent, or Firm* — Hewlett Packard Enterprise Patent Department

(57) ABSTRACT

A system is provided for computer networking. The system includes a first frame installed in a rack. The first frame includes a first frame shuffle that interconnects resource modules within the first frame and a first rocker-arm plenum that interconnects resource modules of the first frame with resource modules of other frames of the rack through a high-bandwidth fabric. The system also includes a second frame installed in the rack. The second frame includes a second frame shuffle that interconnects resource modules within the second frame and a second rocker-arm plenum communicatively coupled to the first rocker-arm plenum, wherein the second rocker-arm plenum interconnects resource modules of the second frame with resource modules of other frames of the rack through the high-bandwidth fabric. The system further includes a frame bridge. The frame bridge includes a first bracket slidably connected to a second bracket. The second bracket contains a data connector including a first terminal and a second terminal such that the data connector is contained within the frame bridge, and wherein the first terminal is coupled to the first frame shuffle and the second terminal is coupled to the second frame (Continued)

shuffle such that the first frame shuffle is communicatively coupled to the second frame shuffle.

8 Claims, 29 Drawing Sheets

(51) Int. Cl.
    *H01R 25/00*          (2006.01)
    *H01R 13/72*          (2006.01)
    *H04Q 1/06*           (2006.01)

(58) Field of Classification Search
    USPC .......... 174/72 R; 361/679.49, 725, 733, 735,
                                                                         361/742, 758
    See application file for complete search history.

(56) References Cited

U.S. PATENT DOCUMENTS

| | | | |
|---|---|---|---|
| 6,927,974 B2 | 8/2005 | Robillard | |
| 7,013,088 B1 | 3/2006 | Jiang et al. | |
| 7,087,840 B2 * | 8/2006 | Herring | H02G 3/0431 |
| | | | 174/101 |
| 7,303,336 B2 | 12/2007 | Kayner et al. | |
| 7,782,632 B2 | 8/2010 | Della Fiora | |
| 7,916,502 B2 * | 3/2011 | Papakos | H05K 7/1425 |
| | | | 174/72 A |
| 8,038,015 B2 * | 10/2011 | Laursen | H04Q 1/09 |
| | | | 211/26 |
| 8,077,455 B2 * | 12/2011 | Jian | G06F 1/189 |
| | | | 248/906 |
| 8,351,204 B2 | 1/2013 | Yeo et al. | |
| 8,472,183 B1 * | 6/2013 | Ross | H05K 7/20736 |
| | | | 361/679.48 |
| 8,737,090 B2 | 5/2014 | Jai | |
| 9,099,826 B2 | 8/2015 | Nichols et al. | |
| 9,231,358 B1 | 1/2016 | Schow | |
| 9,292,054 B2 | 3/2016 | Cai | |
| 9,459,426 B2 * | 10/2016 | Leigh | G02B 6/4452 |
| 2003/0223193 A1 | 12/2003 | Smith | |
| 2004/0264145 A1 * | 12/2004 | Miller | H05K 7/1489 |
| | | | 361/725 |
| 2007/0117458 A1 | 5/2007 | Winker et al. | |
| 2008/0013275 A1 | 1/2008 | Beckley et al. | |
| 2009/0263992 A1 | 10/2009 | Dittus | |
| 2010/0263902 A1 * | 10/2010 | Jacobson | H02G 3/045 |
| | | | 174/100 |
| 2011/0051341 A1 | 3/2011 | Baldassano | |
| 2012/0069514 A1 | 3/2012 | Ross | |
| 2013/0196538 A1 | 8/2013 | Takeuchi | |
| 2014/0240909 A1 | 8/2014 | Stewart | |
| 2014/0334110 A1 | 11/2014 | Nichols | |
| 2014/0369654 A1 * | 12/2014 | Magason | G02B 6/4261 |
| | | | 385/92 |
| 2015/0208554 A1 | 7/2015 | Leigh et al. | |
| 2015/0327381 A1 | 11/2015 | Alshinnawi | |
| 2016/0124470 A1 | 5/2016 | Leigh et al. | |
| 2017/0371385 A1 | 12/2017 | Leigh | |
| 2018/0199117 A1 * | 7/2018 | Mankinen | H05K 7/1491 |
| 2018/0309236 A1 * | 10/2018 | Leigh | H01R 13/62933 |
| 2018/0352673 A1 * | 12/2018 | Leigh | H05K 7/1489 |

* cited by examiner

COMPUTER NETWORKING INTERCONNECTORS

BACKGROUND

Networking devices are often mounted within a rack when used in a large-scale computing environment, such as an enterprise network for a company. When mounted within the rack, the networking devices are interconnected. Through these interconnections, servers, switches, routers, and other networking devices intercommunicate with one another, with user devices, and with the Internet. Given the cost associated with the networking hardware, these large-scale computing environments are designed to be as compact as possible. Based on a network design, frames may be installed in a rack with an intervening air gap or intervening network devices.

BRIEF DESCRIPTION OF THE DRAWINGS

For a more complete understanding of the present disclosure, examples in accordance with the various features described herein may be more readily understood with reference to the following detailed description taken in conjunction with the accompanying drawings, where like reference numerals designate like structural elements, and in which.

Figure 1:
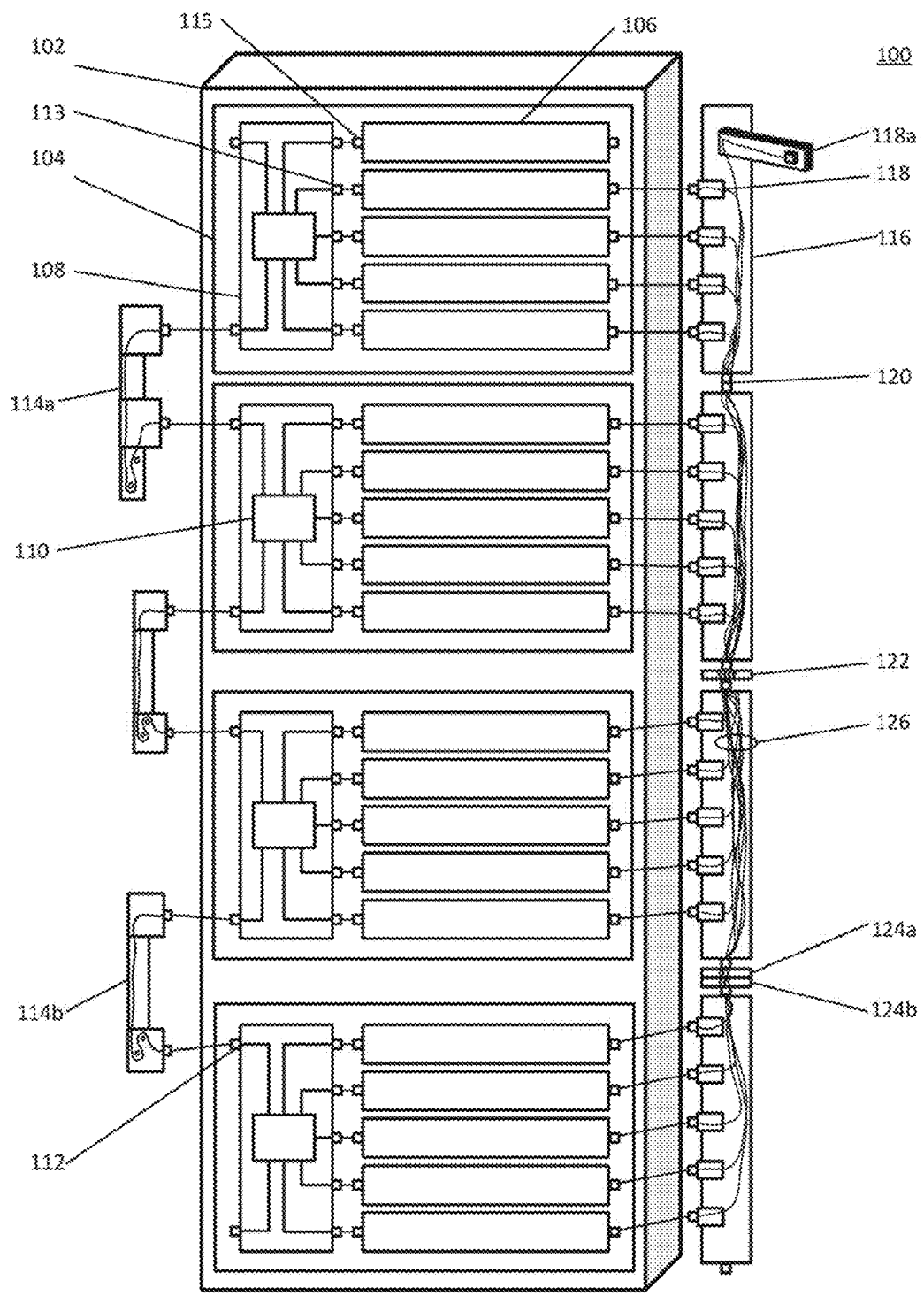
FIG. 1 illustrates an example rack containing frames interconnected with frame bridges and rocker-arm plenums.

Certain examples have features that are in addition to or in lieu of the features illustrated in the above-referenced figures.

DETAILED DESCRIPTION

In certain example large-scale computing environments, racks contain frames, which receive resource modules. For example, a rack may contain three frames, each of which receive storage, compute, and fabric modules. Racks include a mounting apparatus that allows frames to be mounted in one Rack Unit height increments within the rack. A Rack Unit (RU or U) is 1.75" and it is the minimum height required for a single-height rack-mounted device to be installed in. Mounting two single-height devices on adjacent mounting points on the rack results in the devices being positioned directly adjacent to one another. In some examples, frames are 5 U in height. In various examples, a rack may be any height, with certain examples being 22 U, 42 U, and 50 U in height. Certain example racks are able to contain multiple frames, the maximum number of which is dictated by the height of the frame and the height of the rack.

The resources contained in a rack are interconnected as described in a network topology. For example, computing resources are connected to storage resources through fabric resources and computing resources are connected to other computing resources through fabric resources. There are many types of interconnections used in various large-scale computing environments. For example, resources may be interconnected via individual cables (e.g. CAT5e, CAT6). However, the resulting "rat's nest" of cables are extremely difficult to maintain once the computing environment has exceeded a small scale. Further, reconfiguration of the network is difficult and replacement of resources can be arduous, depending on the specific layout. In another example, resources are interconnected via hard-wired midplanes and backplanes. These interconnections are configured on a printed circuit board, to which the resources are connected. While midplanes and backplanes are tidier than cabling every interconnection, they are not modifiable to be scale once the interconnections are printed on a circuit board and they are limited in size for high-speed signals.

In certain examples of the aforementioned embodiment, the large-scale computing environment includes frames that allow increased flexibility in how the resource modules are laid out, allowing any type of resource module to be received at any slot of the frame. For example, a first frame could include all storage modules, a second frame could include all compute modules, and a third frame could include all fabric modules. In another example, a first frame could include storage modules and compute modules, a second frame could include fabric modules, and a third frame could include fabric modules and storage modules. This flexibility also allows the large-scale computing environment to be reconfigured more easily. A resource module of a frame may be removed and replaced with a different type of resource module.

In order to allow interconnection of these dynamically replaceable resource modules, and in order to reduce the amount of confusing cabling, example large-scale computing environments interconnect resource modules via frame shuffles and rocker-arm plenums. Frame shuffles interconnect resource modules within a frame, and rocker-arm plenums provide a high-bandwidth interconnection among the frames in a rack. In some examples, frame shuffles and rocker-arm plenums are optical interconnectors for use with photonics-capable resource modules. In other examples, frame shuffles and rocker-arm plenums are electrical interconnectors comprising copper cables. This disclosure anticipates any form of interconnection between resource modules.

In certain examples, frame shuffles of successive frames are interconnected through a frame bridge. Throughout this disclosure "successive" refers to two frames positioned without any intervening frames and "adjacent" refers to two frames positioned without any intervening frames and without substantial intervening space. For example, two successive frames may be mounted on the rack such that there is an air gap of one or more rack units between the frames. In another example, two adjacent frames are mounted such that there is substantially less than one rack unit air gap between the frames. Throughout this disclosure, adjacent frames may be referred to as not having an air gap between the frames. In some examples, adjacent frames may directly physically contact one another, resulting in no air gap between the adjacent frames. In other examples, adjacent frames may mount to the rack such that there is a small distance between the frames, but such distance is not substantial, and is treated as if there is no air gap for the purposes of this disclosure.

Figure 3A:
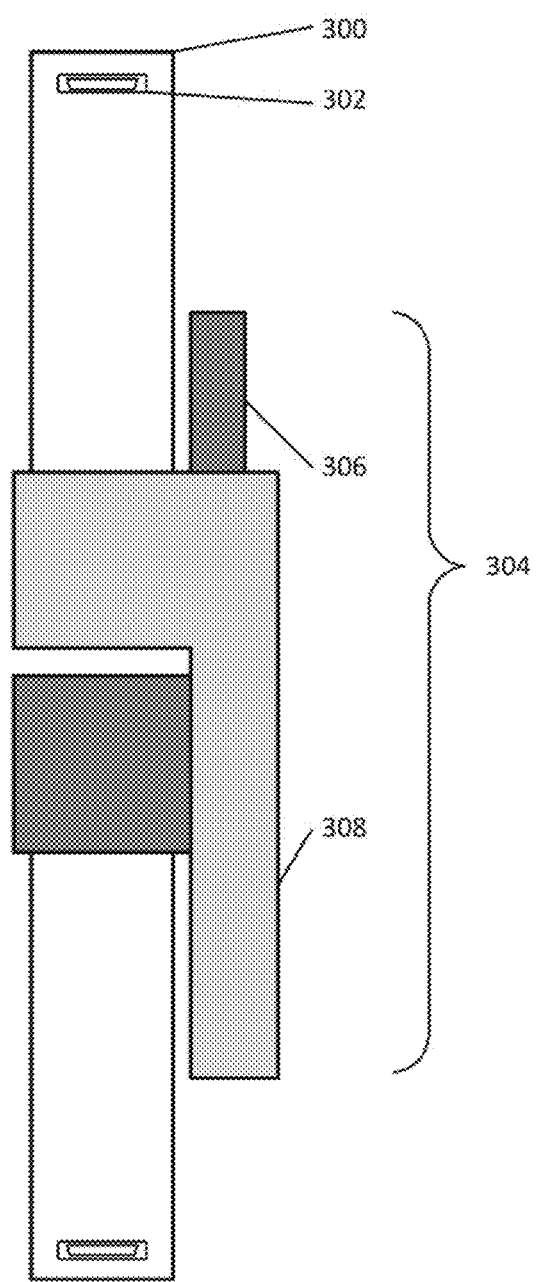
FIGS. 3A-3G illustrate example frame bridges interconnecting frame shuffles of adjacent frames.
Figure 3B:
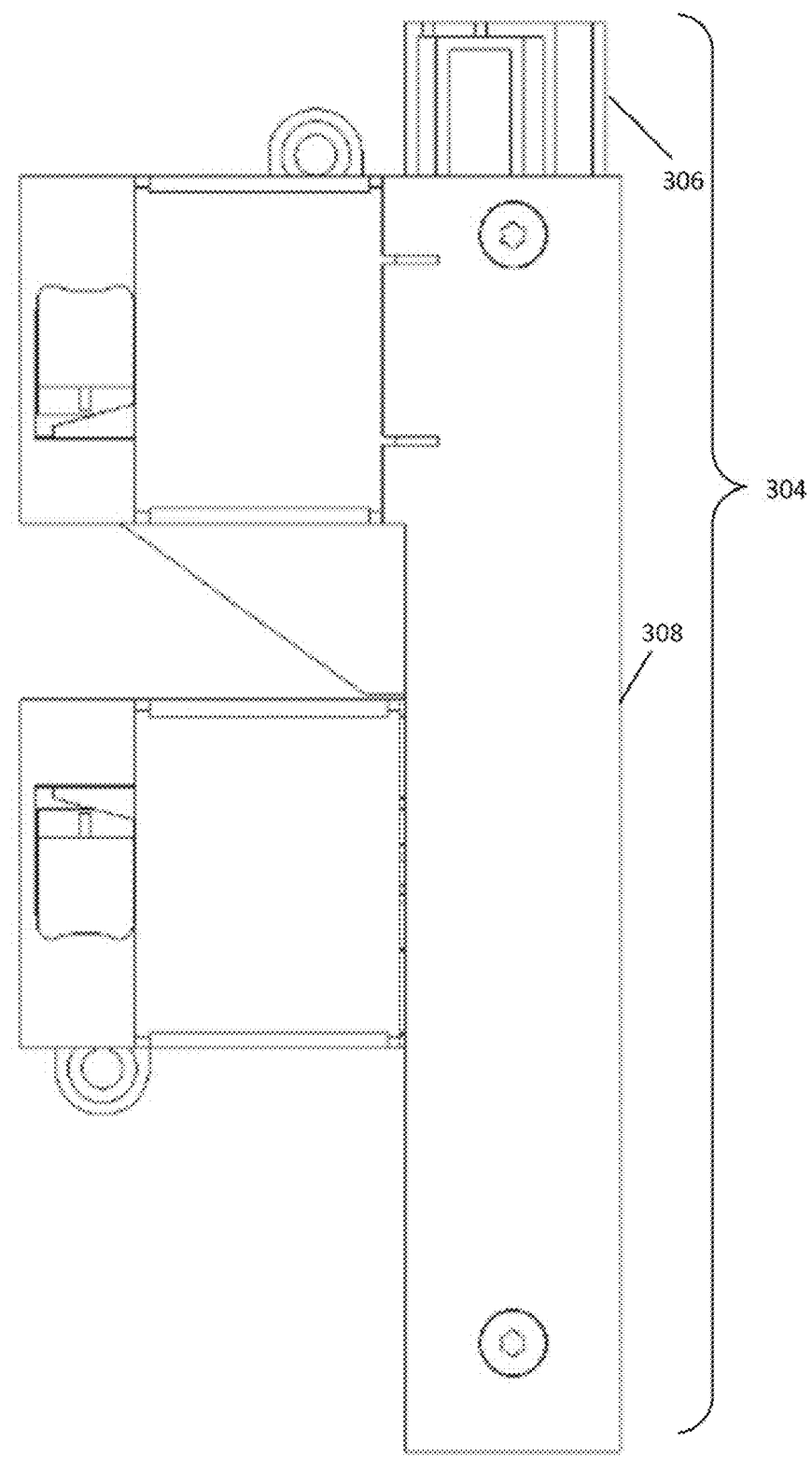
Figure 3C:
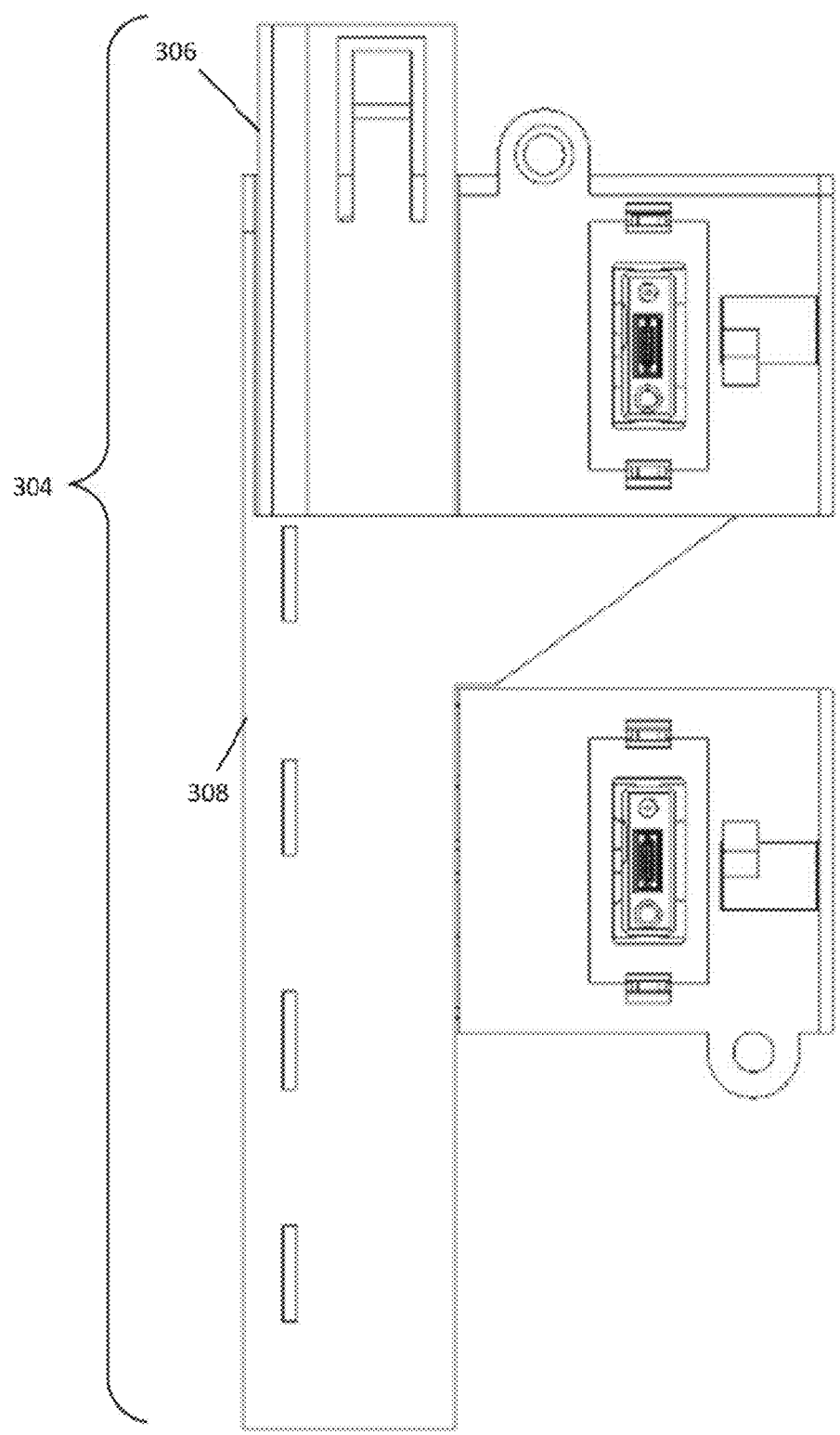
Figure 3D:
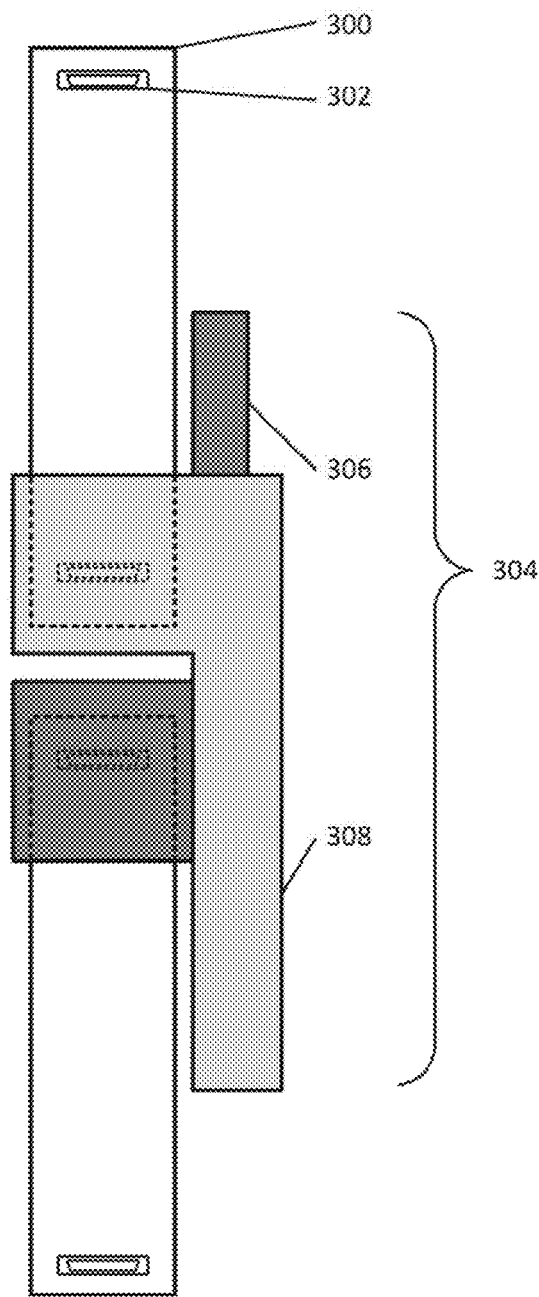

Within certain figures (e.g. FIG. 3) of this disclosure, certain features may be labeled in a previous subfigure (e.g. FIG. 3A) and discussed in reference to a latter subfigure (e.g. FIG. 3D). The labels may be omitted from the latter subfigure for the sake of clarity. It is assumed that like labels apply to like features across all subfigures of a figure, as appropriate given the context.

FIG. 1 illustrates a side view of an example rack containing frames interconnected with frame bridges and rocker-arm plenums. In the interest of clarity, only one of each type of component is labeled throughout the figures, except where clarity requires additional labels. An example large-scale computing environment 100 contains racks 102. In FIG. 1, a single rack 102 is illustrated, and no interconnections to other racks 102 are shown. In the examples illustrated in FIG. 1, the front of rack 102 is located to the left of the figure and the back of rack 102 is located to the right of the figure. Rack 102 contains frames 104. In some examples, frames 104 are mounted to rack 102. Rack 102 may contain a mounting element (not shown) that retains frames 104. For example, frames 104 may be retained via slider channels, clip retainers, screws, hooks, or any other appropriate mechanism (or combination of mechanisms) for retaining devices in a rack. Such mechanisms may be located in the front of the rack, the back of the rack, and at any point in between.

Example frames 104, as illustrated in FIG. 1, are shown, from top to bottom of the figure, adjacent, separated by one rack unit, and separated by multiple rack units. Frame 104 may contain a midplane for power and management signal connections to be distributed to the modules within a frame. The midplane may also allow modules in the front of the frame 104 to optically connect to modules in the back of the frame 104 through the midplane. The frame 104 may include electrical power infrastructure and thermal management infrastructure.

Each frame 104 contains resource modules 106. In some examples, resource modules 106 are retained in the rear of frame 104. In certain examples, resource modules 106 are coupled to a midplane within frame 104. In certain other examples, resource modules 106 are directly coupled to frame shuffle 108. Frame 104 contains components to retain resource modules 106 in slots. In some examples, frame 104 contains a retaining clip to hold resource modules 106 within the slots of the frame 104. Similarly, frame 104 may contain slots to retain frame shuffles 108. Although, in the examples of FIG. 1, each frame 104 retains five (5) resource modules 106 and one (1) frame shuffle 108, the disclosure contemplates that frame 104 may be designed to retain any number of resource modules 106 and frame shuffles 108.

Frame shuffle 108 is retained in frame 104 and interconnects with resource modules 106. In some embodiments, frame shuffle 108 directly interconnects with resource modules 106. In certain examples, frame shuffle 108 and resource modules 106 include data interconnection terminals 113 and 115, respectively. Data interconnection terminals 113 of frame shuffle 108 are complementary to data interconnection terminals 115 of resource modules 106 such that data interconnection terminals 113 of frame shuffle 108 mate with the respective data interconnection terminals 115 of resource modules 106. Frame shuffle 108 may contain a route processor 110. Route processor 110 receives data through the interconnections to resource modules 106 and routes the data to the appropriate destination resource module 106.

In some embodiments, frame shuffle 108 is a passive frame shuffle. A passive frame shuffle includes, in part, interconnections between each data interconnection terminal 113 of frame shuffle 108. Frame shuffle 108 is configured so that each data interconnection terminal 113 contains multiple data connectors, each data connector terminating at another data interconnection terminal 113 of frame shuffle 108. Each data interconnection terminal 113 of frame shuffle 108 is interconnected to every other data interconnection terminal 113 of frame shuffle 108. In embodiments including a passive frame shuffle, frame shuffle 108 may not contain a route processor 110.

In some other embodiments, frame shuffle 108 is an active frame shuffle. An active frame shuffle includes, in part, route processor 110 to route data to data interconnection terminals 113 of frame shuffle 108. Data interconnection terminals 113 are coupled to route processor 110 to allow bidirectional communication between route processor 110 and each data interconnection terminal 113 of frame shuffle 108.

In some examples, frame shuffle 108 includes bridging terminals 112. Bridging terminals 112 allow frame shuffles 108 to be connected to one another. Bridging terminals 112 may be positioned on an opposite surface of frame shuffle 108 than data interconnection terminals 113. Bridging terminals 112 are interconnected with data interconnection terminals 113. In some examples, each bridging terminal 112 contains an interconnection to every data interconnection terminals 113. In some other examples, each bridging terminal 112 is bidirectionally coupled to route processor 110. For example, as shown in FIG. 1, each frame shuffle 108 contains two bridging terminals 112, each of which is communicatively coupled to their respective route processors 110.

In certain examples, frame shuffles 108 are interconnected through a frame bridge 114. Frame bridge 114 couples to a bridging terminal 112 of a first frame shuffle 108 and to a bridging terminal 112 of a second successive frame shuffle 108. Frame bridges may be configured as extended or as contracted. Frame bridge 114a is configured as contracted, and frame bridge 114b is extended. A contracted frame bridge is configured to couple frame shuffles 108 of two adjacent frames 104. Although illustrated in FIG. 1 as an indirect coupling between terminals of frame bridges 114 and the respective bridging terminals 112 of frame shuffles 108, this disclosure also contemplates a direct coupling between the terminals of frame bridges 114 and the respective bridging terminals 112. An extended frame bridge is configured to couple frame shuffles 108 of two successive frames 104 that are not adjacent. For example, frame bridge 114b couples frame shuffles 108 of frames 104 that are separated by a 2 RU air gap. In some examples, frame bridge 114 may be configured to couple frames shuffles 108 in frames 104 that are one of: adjacent and one 1 RU separated. In some other examples, frame bridge 114 may be configured to couple frame shuffles 108 in frames 104 that are separated by any non-negative integer (including zero) multiple of a rack unit, up to a maximum distance of separation (e.g. two rack units, three rack units). Frame bridge 114 may include a data connection, which interconnects frame shuffles 108 via their respective bridging terminals 112. In some examples, frame bridge 114 wholly contains the data connection, except for exposed portions of the terminals of the frame bridge 114, in all configurations of frame bridge 114. In certain examples, the exposed portions of the terminals are components of frame bridge 114 separate from and coupled to the data connection. In certain other examples, the exposed portions of the terminals are components of the data connection, and the terminals are seated into receiving portions of frame bridge 114.

In some examples, each frame 104 corresponds to a rocker-arm plenum 116. Rocker-arm plenum 116 contains rocker arms 118. Each rocker arm 118 corresponds to a resource module 106 of frame 104. Each rocker arm 118 contains a terminal that can couple to a complementary terminal on the corresponding resource module 106. In certain examples, rocker arm 118 rocks to an "open" position, wherein the corresponding resource module 106 can be serviced, removed, and replaced. Rocker arm 118 also rocks to a "closed" position, wherein rocker arm 118 is coupled to the corresponding resource module. Although rocker arms 118 are shown indirectly coupled to resource modules 106 in FIG. 1, this disclosure also contemplates rocker arms 118 being directly coupled to resource modules 106. Rocker-arm plenum 116 interconnects resource modules 106 through a high-bandwidth fabric (e.g. optical, copper). In some embodiments, rocker-arm plenum 116 includes protruding latches and latch receivers to allow successive rocker-arm plenums 116 to couple together. In some examples, rocker-arm plenum 116 is directly coupled 120 to an adjacent rocker-arm plenum 116 when the corresponding frames 104 are adjacent. When the corresponding frames 104 are one (1) rack unit separated, rocker-arm plenum 116 is coupled to the successive rocker-arm plenum 116 via an extender 122. When the corresponding frames 104 are separated by more than one rack unit, rocker-arm plenum 116 is coupled to the successive rocker-arm plenum 116 via multiple extenders 124 (e.g. extenders 124a and 124b in a two (2) rack unit separation). Although FIG. 1 illustrates one (1) rack unit height extenders, this disclosure contemplates extenders of any height, as appropriate.

In some examples, rocker-arm plenums 116 are fastened to rack 102. In other examples, rocker-arm plenums 116 are fastened to the corresponding frames 104 or to the corresponding resource modules 106. In yet other examples, rocker-arm plenums 116 are standalone or are held in place via the coupling to the terminals of resource modules 106. Rocker-arm plenums 116 are aligned with their corresponding frames 104 to allow rocker arms 118 to couple with the complementary terminals of their corresponding resource modules 106. In some embodiments, rocker-arm plenums 116 are located at the rear of rack 102 and frame bridges 114 are located at the front of rack 102. Rocker-arm plenums 116 may be coupled to a rear corner edge of rack 102 such that when rocker arms 118 are rocked open and closed, they pivot substantially around the axis of the rear corner edge of rack 102.

Rocker-arm plenums 116 may retain a portion of cable harness 126, which includes data connections. In some examples, similar to the passive frame shuffles, each rocker arm 118 is interconnected with every other rocker arm 118 within the same rocker-arm plenum 116. In some examples, each rocker arm 118 is interconnected with every other rocker arm 118, both within the first rocker-arm plenum 116 and within any rocker-arm plenum 116 directly or indirectly coupled to the first rocker-arm plenum 116.

Although frame shuffles 108, frame bridges 114 and rocker-arm plenums 116 all interconnect resource modules 106, they may each be used for different purposes. In some examples, frame shuffles 108 provide intra-frame interconnectivity, coupling resource modules 106 within the same frame 104. Frame bridges 114 provide inter-frame interconnectivity, coupling resource modules 106 across successive frames 104. Rocker-arm plenums 116 provide high-bandwidth rack-scale interconnectivity, coupling resource module 106 anywhere across rack 102. Rocker-arm plenums 116 may also allow inter-rack interconnectivity, which is outside the scope of this disclosure. In some examples, frame shuffles 108 and frame bridges 114 provide relatively low-bandwidth connectivity between resource modules 106 suitable for management commands, whereas rocker-arm plenums 116 provide relatively high-bandwidth connectivity between resource modules 106 suitable for data and network communication.

In an example embodiment, a network administrator may install one or more racks in a data center. The racks include frames that receive resource modules and frame shuffles. Based on a network topology, the network administrator inserts storage modules, compute modules, and fabric modules into the frames. The network administrator installs frame shuffles in the frames that interconnect the resource modules within the frame. In some embodiments, the network administrator installs jumper cables between frame shuffles of subsequent frames. In other embodiments, the network administrator installs frame bridges that conceal the data connector, creating a clean, substantially cableless front view of the rack, reducing potential confusion, maintenance time and miscabling of the devices mounted in the rack. Similarly, the network administrator installs rocker-arm plenums on the rack so that they are aligned with their corresponding frames. The rocker-arm plenums are coupled to one another and receive a cable harness that is contained entirely inside the coupled rocker-arm plenums (and any intervening extenders). The resulting rear of the rack is similarly substantially cableless, reducing cost, reducing potential confusion, maintenance time, and miscabling. In some examples, the cable harness in the rocker-arm plenums and the data connections in the frame bridges are bundles of bare optical fibers. In some other examples, the cable harness and the data connections are copper cables.

Figure 2A:
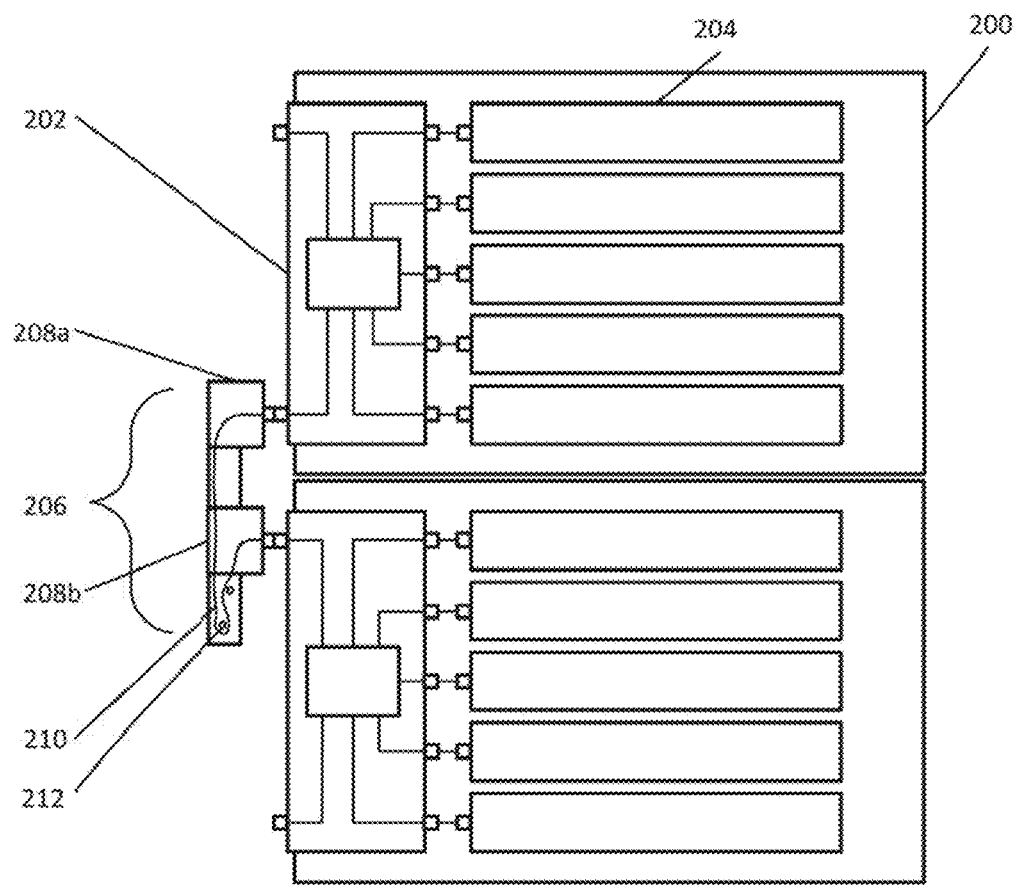
FIG. 2A illustrates example frames positioned adjacent to one another and interconnected with a frame bridge.
Figure 2B:
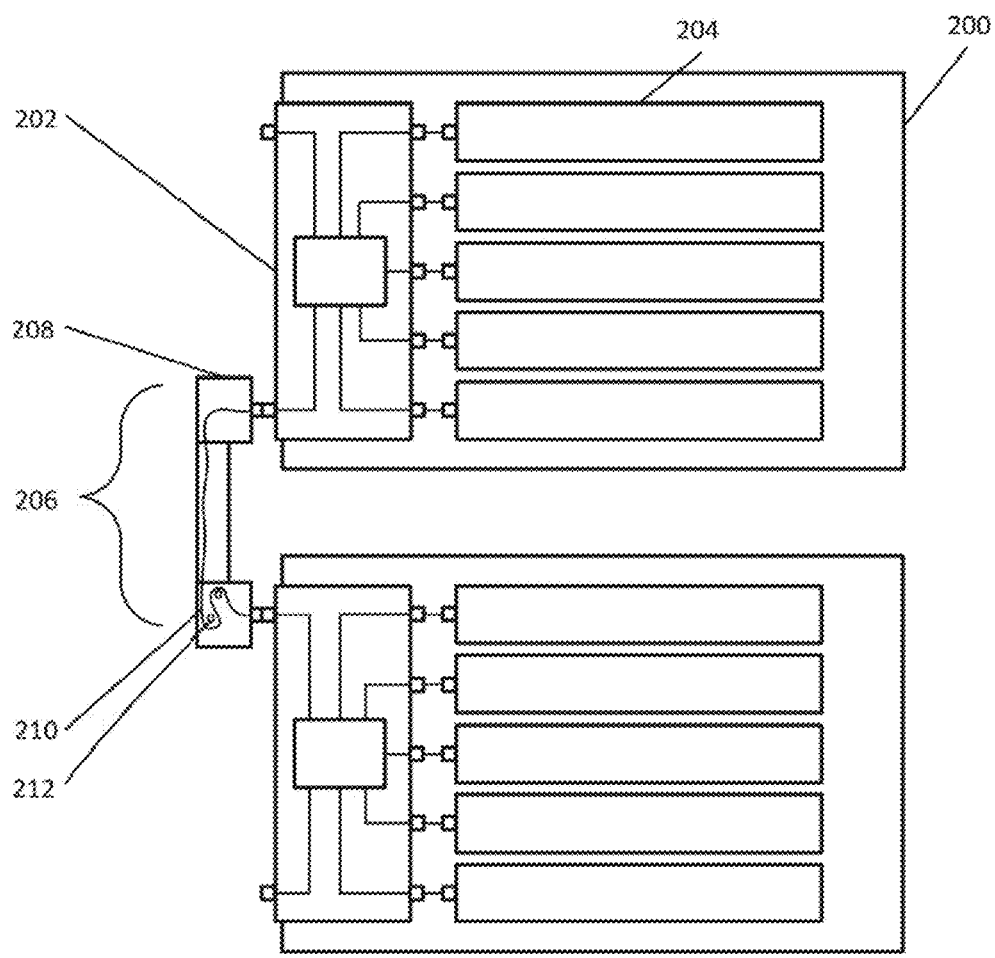
FIG. 2B illustrates example frames positioned with an air gap separation between one another and interconnected with a frame bridge.

FIG. 2 illustrate side views of example frames interconnected by a frame bridge. FIG. 2A shows two adjacent frames interconnected by a frame bridge. FIG. 2B shows two successive frames separated by an air gap. The two successive frames are interconnected by a frame bridge.

FIG. 2A illustrates example adjacent frames interconnected by a frame bridge. Frames 200 may be mounted within a rack such that they are adjacent to one another. Frames 200 include a frame shuffle 202 coupled to resource modules 204. Frame bridge 206 couples to bridging terminals of frame shuffles 202. In some examples, frame bridge 206 couples to the bottom bridging terminal of the top frame 200 and to the top bridging terminal of the bottom frame 200. Frame bridge 206 includes a first connector bracket with a first connector housing 208a and a second connector bracket with a second connector housing 208b. The first connector bracket and the second connector bracket are slidably connected. The second connector bracket is contained within the first connector bracket such that frame bridge 206 may be configured as extended or contracted by altering the distance between first connector housing 208a and second connector housing 208b. In some examples, the first connector bracket and the second connector bracket include stops that position first connector housing 208a and second connector housing 208b at a predetermined distance (e.g. zero rack units, one rack unit, two rack units).

Frame bridge 206 contains data connection 210. In some examples, data connection 210 is wholly contained within frame bridge 206. Data connection 210 may be a bundle of optical fibers or a bundle of copper cables. Data connection 210 connects a terminal in first connector housing 208a to a terminal in second connector housing 208b. In some examples, data connection 210 includes the terminal in first connector housing 208a and the terminal in second connector housing 208b, and each connector housing 208 receives the respective terminal, which is seated within the housing. Each terminal is partially contained within the respective connector housing such that the exposed portion of the terminal faces the complementary terminals of frame shuffles 202. In the examples of FIG. 2A, frame bridge 206 extends in the vertical direction, and the terminals within the respective connector housings 208 face orthogonally to the direction of extension (to the right).

When frame bridge 206 is extended and contracted, data connection 210 moves within the first connector bracket and the second connector bracket. Guides 212 (represented by circles in FIG. 2) restrict the motion of data connection 210 so that data connection 210 does not bind or otherwise restrict the motion of frame bridge 206 within the designed operation of frame bridge 206. For example, data connection 210 may fold around a first guide 212 when contracted and may fold around the first guide 212 and a second guide 212 when extended. In some examples, guides 212 are circular pegs (as illustrated in FIG. 2A). In some other examples, guides 212 are curvilinear rails or any other retaining mechanisms appropriate for guiding data connection 210.

FIG. 2B illustrates example successive frames interconnected by an extended frame bridge. Frames 200 may be mounted within a rack separated by an air gap. In some examples, the air gap is one (1) rack unit. In some other examples, the air gap is more than one rack unit. Frame bridge 206 is extended so that the terminals in the connector housings 208 correspond to the respective bridging terminals of frame shuffles 202.

Frame bridge 206 contains data connection 210. In some examples, data connection 210 is wholly contained within frame bridge 206. Data connection 210 may be a bundle of optical fibers or a bundle of copper cables. Data connection 210 connects a terminal in a first connector housing 208 to a terminal in a second connector housing 208. In some examples, data connection 210 includes the terminal in the first connector housing 208 and the terminal in the second connector housing 208, and each connector housing 208 receives the respective terminal, which is seated within the housing. Each terminal is partially contained within the respective connector housing such that the exposed portion of the terminal faces the complementary terminals of frame shuffles 202. In the examples of FIG. 2B, frame bridge 206 extends in the vertical direction, and the terminals within the respective connector housings 208 face orthogonally to the direction of extension (to the right).

Data connection 210 is restricted by guides 212 when frame bridge 206 is in the extended configuration. In the examples of FIG. 2B, data connection 210 folds over guides 212 twice near the lower terminal of frame bridge 206.

FIG. 3 illustrate a frame bridge interconnecting adjacent frame shuffles. Each subsequent FIG. 3 exposes additional hidden components to more fully illustrate the interconnection of the frame shuffles. In FIG. 3, like numerals refer to like features.

FIG. 3A illustrates a front view of an example frame bridge interconnecting adjacent frame shuffles. FIG. 3B is a detailed illustration of a front view of an example frame bridge in a contracted configuration. FIG. 3C is a detailed illustration of a rear view (i.e. rotated 180 degrees around the vertical axis, or flipped horizontally) of the frame bridge of FIG. 3B. In some examples, frame shuffles 300 may be retained in adjacent frames. Frame shuffles 300 include top and bottom terminals 302. In the examples of FIG. 3A, the top terminal of the top frame shuffle 300 is shown and the bottom terminal of the bottom frame shuffle 300 is shown.

Frame bridge 304 interconnects top frame shuffle 300 with bottom frame shuffle 300. Frame bridge 304 is in the contracted configuration. Frame bridge 304 is coupled to the bottom terminal (not shown) of top frame shuffle 300 and the top terminal (not shown) of bottom frame shuffle 300. Frame bridge 304 contains first connector bracket 306 and second connector bracket 308. In the examples of FIG. 3A, a terminal seated within first connector bracket 306 is coupled to the top terminal of bottom frame shuffle 300 and a terminal seated within second connector bracket 308 is coupled to the bottom terminal of top frame shuffle 300. In some embodiments, first connector bracket 306 contains lids that open to expose the terminal seated within first connector bracket 306 and a data connection within first connector bracket 306. In some embodiments, second connector bracket 308 contains lids that open to expose the terminal seated within second connector bracket 308 and a data connection within second connector bracket 308.

FIG. 3D makes connector housing portions of first connector bracket 306 and second connector bracket 308 translucent to show the obscured portions of frame shuffles 300, including bottom connector 302 of top frame shuffle 300 and top connector 302 of bottom frame shuffle 300. The dashed lines in FIG. 3B represent features obscured by translucent portions of frame bridge 304.

In some examples, a terminal seated within a connector housing of first connector bracket 306 is coupled to the top terminal of bottom frame shuffle 300 and a terminal seated within a connector housing of second connector bracket 308 is coupled to the bottom terminal of top frame shuffle 300. Frame bridge 308 is configured in the contracted position wherein the terminals seated within connector brackets 306 and 308 are aligned with the complementary terminals 302 of frame shuffles 300.

Figure 3E:
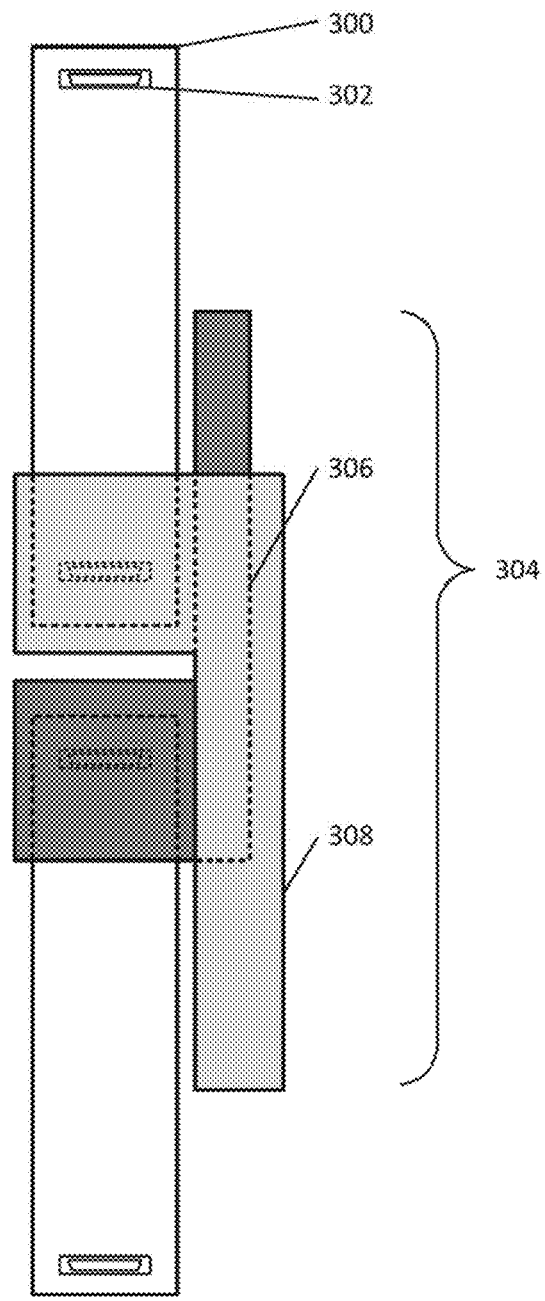

FIG. 3E makes portions of second connector bracket 308 translucent to expose internal portions of first connector bracket 306. The dashed lines in FIG. 3E represent features obscured by translucent portions of frame bridge 304. When frame bridge 304 is configured in the contracted position, a portion of first connector bracket 306 is retained within second connector bracket 308. In some examples, first connector bracket 306 is slidably engaged to second connector bracket 308. For example, first connector bracket 306 may slide vertically in relation to second connector bracket 308.

In some examples, first connector bracket 306 includes a connector housing and a connector conduit and second connector bracket 308 includes a connector housing and a connector conduit. The connector conduit of first connector bracket 306 is retained within the connector conduit of second connector bracket 308. When frame bridge 304 is in the contracted configuration, a portion of the connector conduit of first connector bracket 306 resides in the connector conduit of second connector bracket 308 and another portion of the connector conduit of first connector bracket 306 is exposed.

Figure 3F:
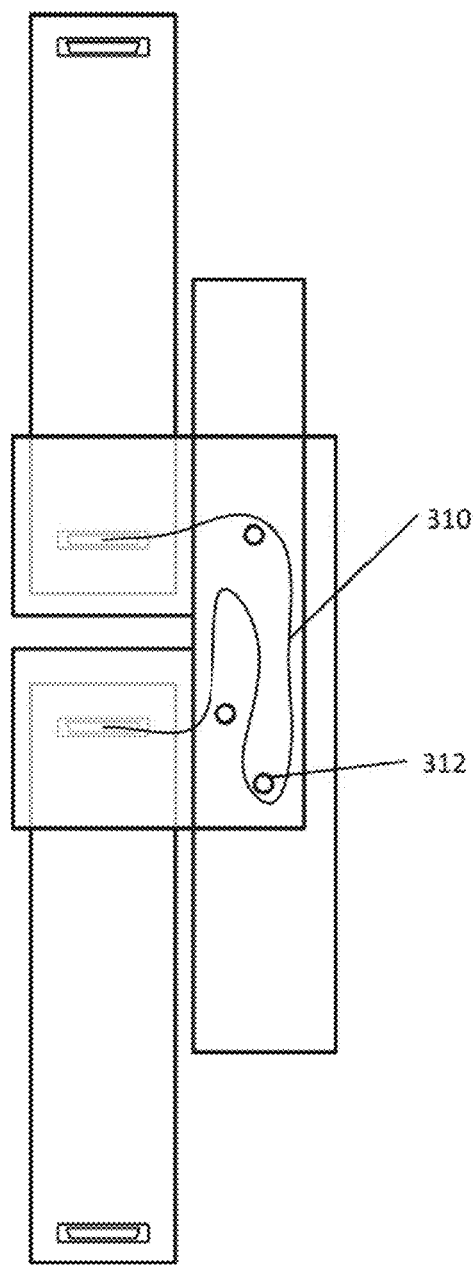
Figure 3G:
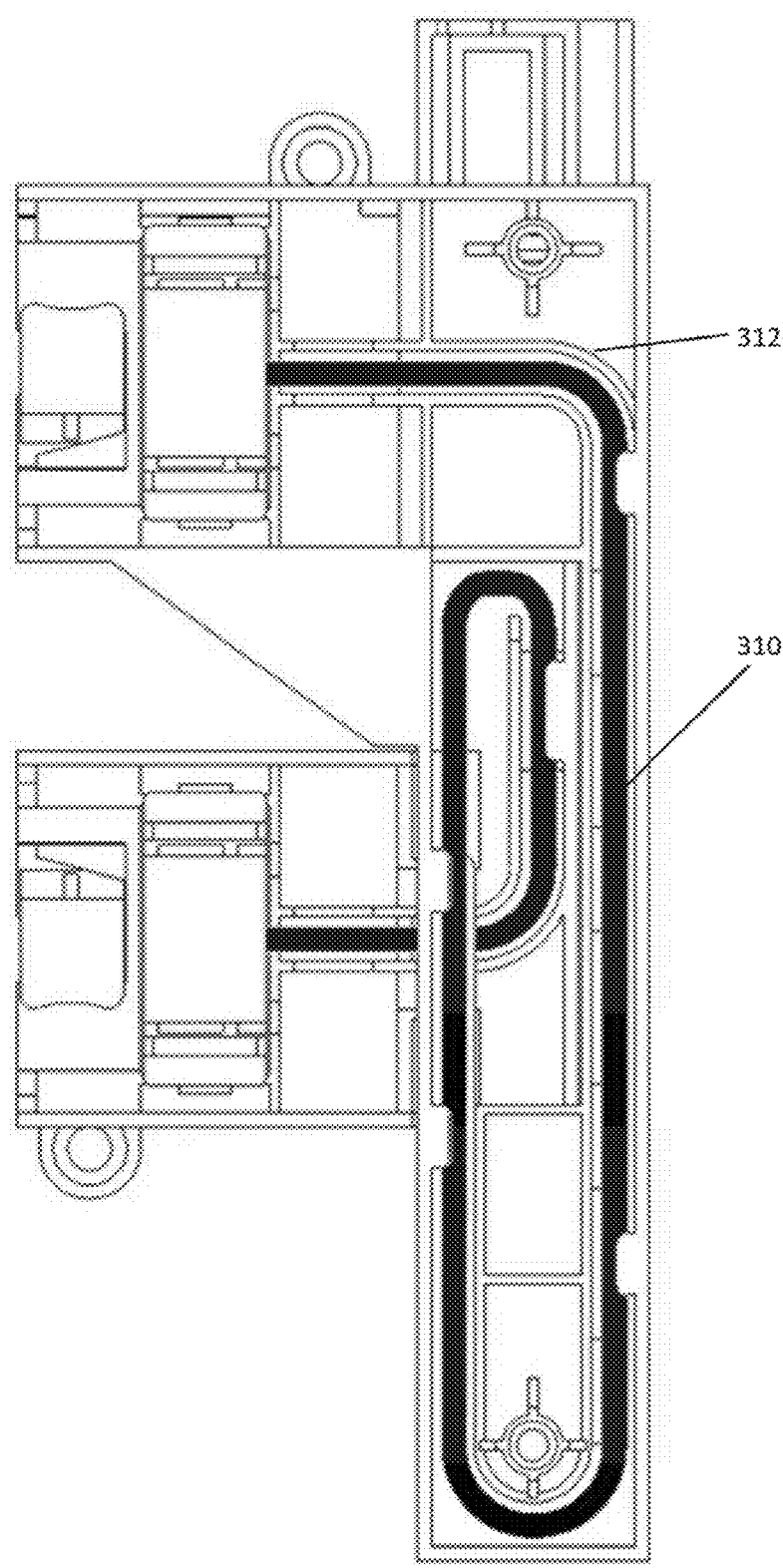

FIG. 3F makes external components of frame bridge 304 transparent. FIG. 3G is a detailed illustration of frame bridge 304 in a contracted configuration with transparent external components. In FIGS. 3F-3G, like numerals refer to like features. The grey lines represent portions of frame shuffles 300 that are obscured by frame bridge 304. Frame bridge 304 contains a data connection 310 that interconnects lower terminal 302 of top frame shuffle 300 to top terminal 302 of lower frame shuffle 300. Portions of data connection 310 pass through a connector conduit of first connector bracket 306 and a connector conduit of second connector bracket 308. The portions of data connection 310 in the connector conduits move when frame bridge 304 is configured as extended or contracted. The portions of data connection 310 are restricted in movement by guides 312. In some examples, guides 312 are contained in the connector conduit of first connector bracket 306, the connector conduit of second connector bracket 308, or both. When frame bridge 304 is configured as extended or contracted, guides 312 may move in relation to one another or in relation to data connection 310. In certain configurations, data connection 310 may tightly conform to certain guides 312 and separate from certain other guides 312, whereas in certain other configurations, data connection 310 may tightly conform to all guides 312.

FIG. 4 illustrate a frame bridge interconnecting successive frame shuffles. Each subsequent FIG. 4 exposes additional hidden components to more fully illustrate the interconnection of the frame shuffles.

Figure 4A:
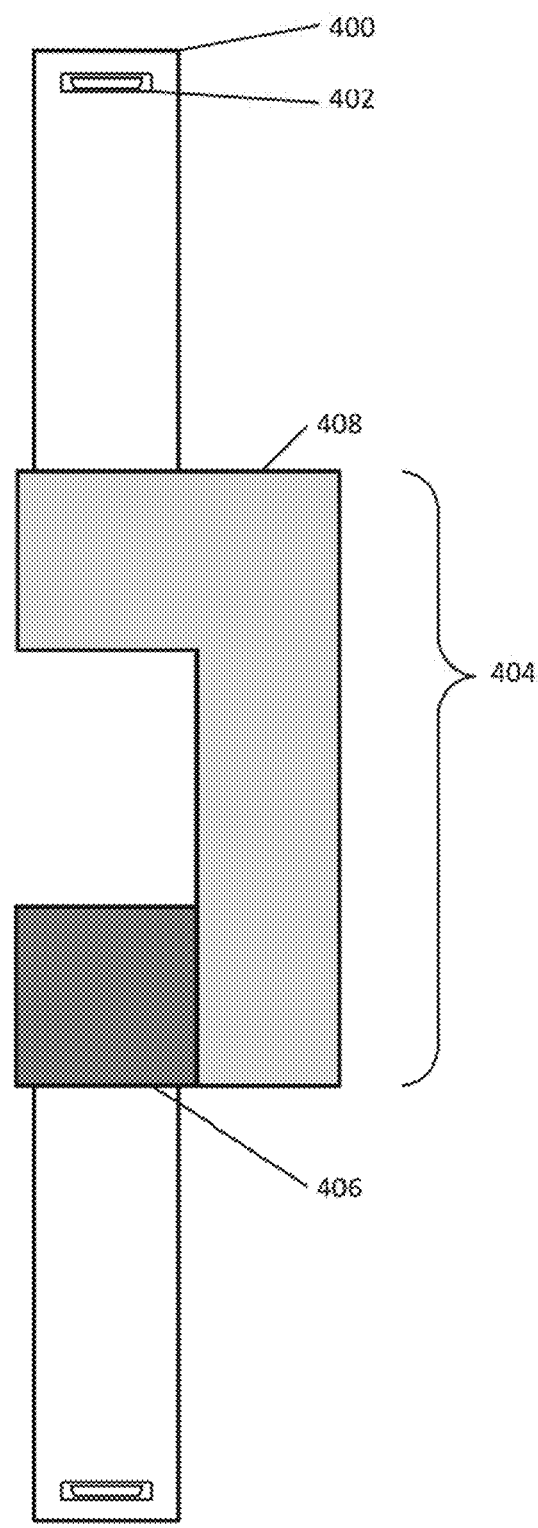
FIGS. 4A-4G illustrate example frame bridges interconnecting frame shuffles of frames separated by an air gap.
Figure 4B:
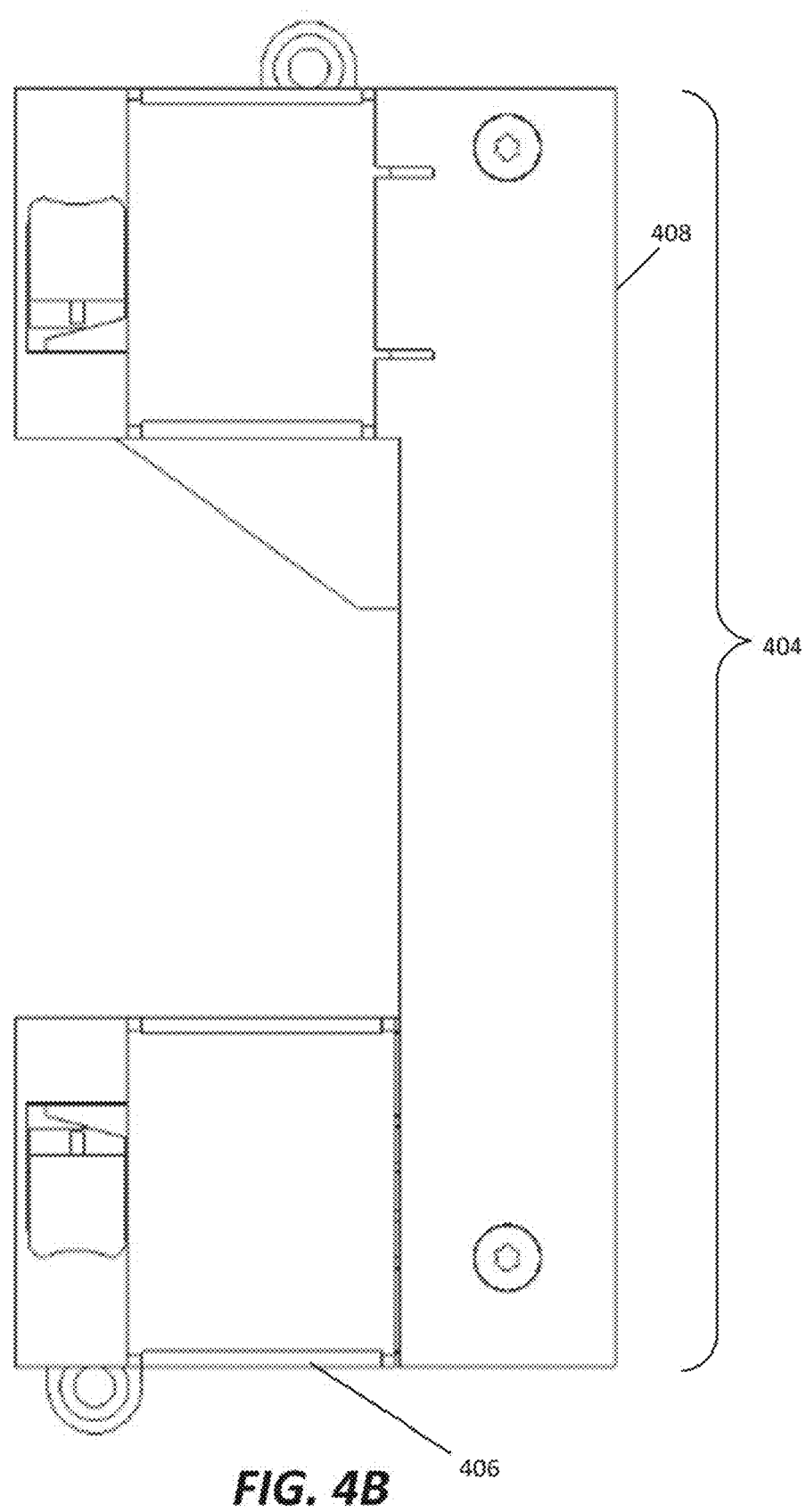
Figure 4C:
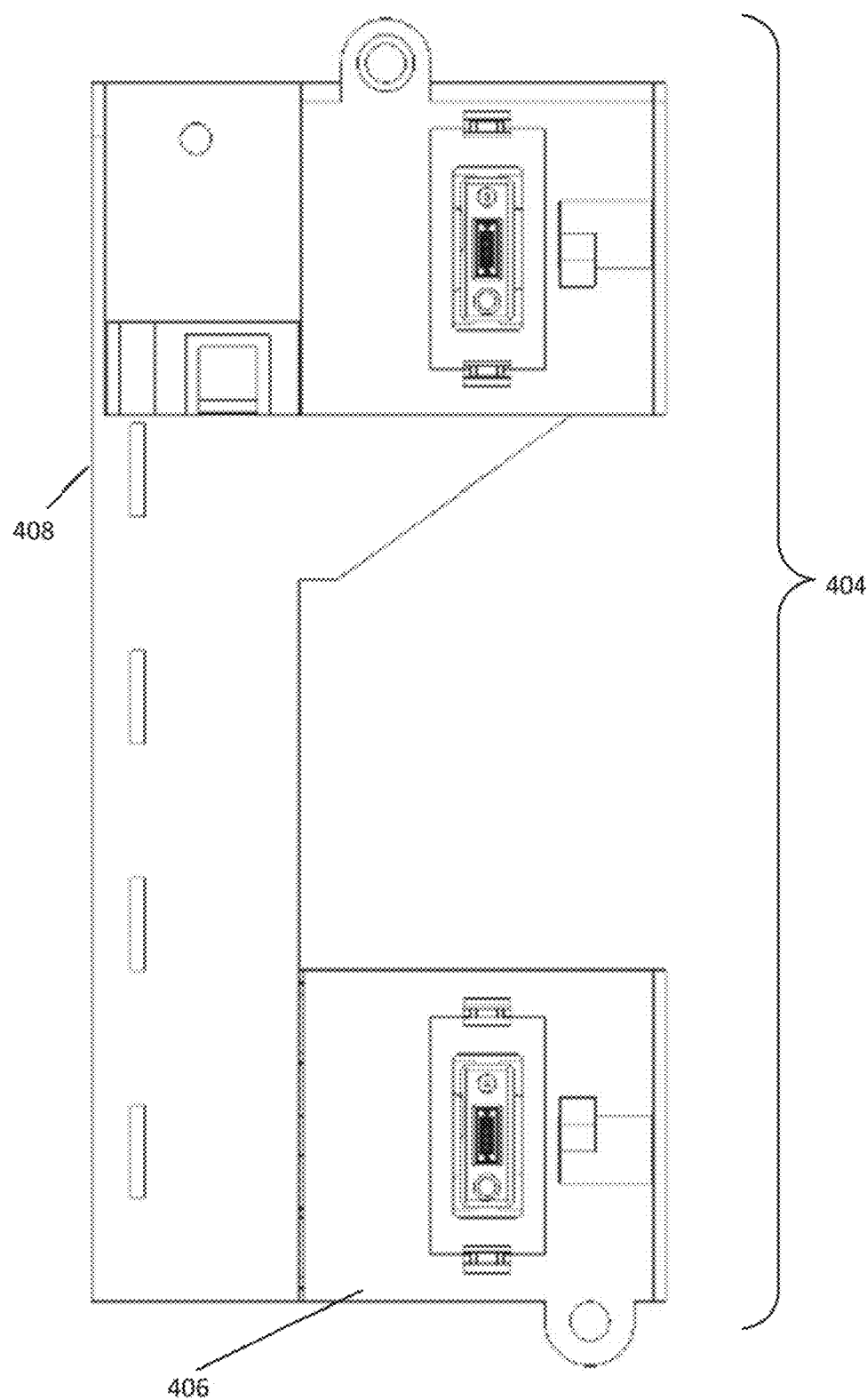

FIG. 4A illustrates a front view of a frame bridge interconnecting successive frame shuffles. FIG. 4B is a detailed illustration of a front view of an example frame bridge in an extended configuration. FIG. 4C is a detailed illustration of a rear view (i.e. rotated 180 degrees around the vertical axis, or flipped horizontally) of the frame bridge of FIG. 4B. In some examples, frame shuffles 400 may be retained in successive frames. In certain examples, the successive frames are mounted in a rack separated by an air gap of one or more rack units. Frame shuffles 400 include top and bottom terminals 402. In the examples of FIG. 4A, the top terminal of the top frame shuffle 400 is shown and the bottom terminal of the bottom frame shuffle 400 is shown.

Frame bridge 404 interconnects top frame shuffle 400 with bottom frame shuffle 400. Frame bridge 404 is in the extended configuration. Frame bridge 304 is coupled to the bottom terminal (not shown) of top frame shuffle 400 and the top terminal (not shown) of bottom frame shuffle 400. Frame bridge 404 contains first connector bracket 406 and second connector bracket 408. In the examples of FIG. 4A, a terminal seated within first connector bracket 406 is coupled to the top terminal of bottom frame shuffle 400 and a terminal seated within second connector bracket 408 is coupled to the bottom terminal of top frame shuffle 400. In some embodiments, first connector bracket 406 contains lids that open to expose the terminal seated within first connector bracket 406 and a data connection within first connector bracket 406. In some embodiments, second connector bracket 408 contains lids that open to expose the terminal seated within second connector bracket 408 and a data connection within second connector bracket 408.

Figure 4D:
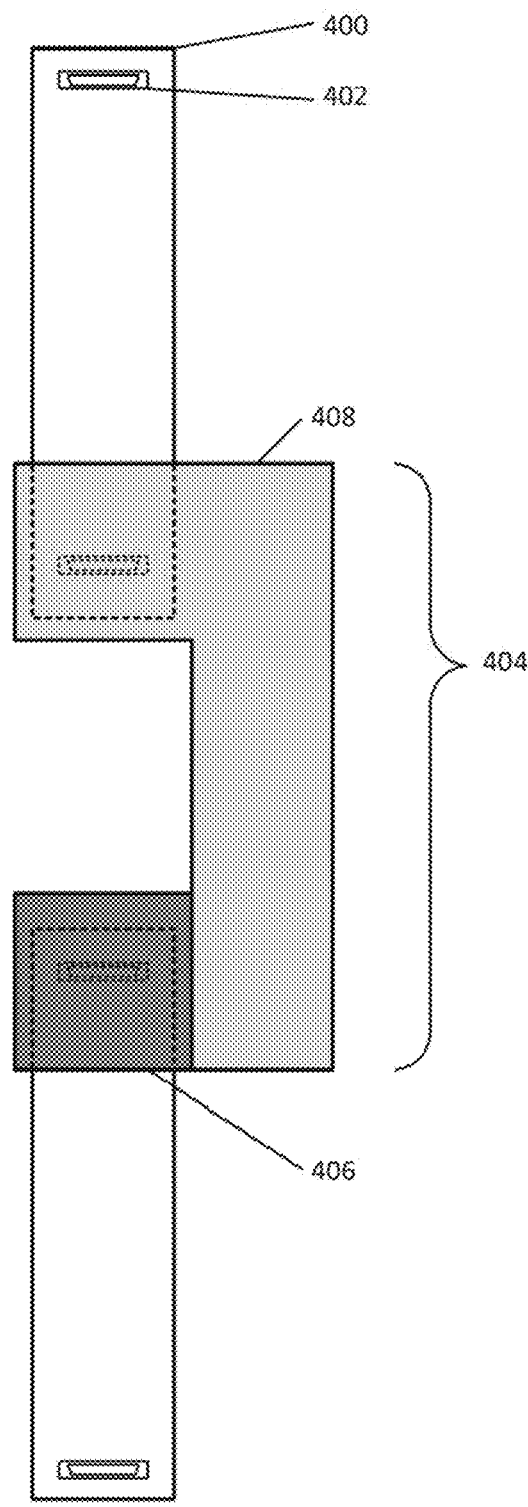

FIG. 4D makes connector housing portions of first connector bracket 406 and second connector bracket 408 translucent to show the obscured portions of frame shuffles 400, including bottom connector 402 of top frame shuffle 400 and top connector 402 of bottom frame shuffle 400. The dashed lines in FIG. 4B represent features obscured by translucent portions of frame bridge 404.

In some examples, a terminal seated within a connector housing of first connector bracket 406 is coupled to the top terminal of bottom frame shuffle 400 and a terminal seated within a connector housing of second connector bracket 408 is coupled to the bottom terminal of top frame shuffle 400. Frame bridge 408 is configured in the extended position wherein the terminals seated within connector brackets 406 and 408 are aligned with the complementary terminals 402 of frame shuffles 400.

Figure 4E:
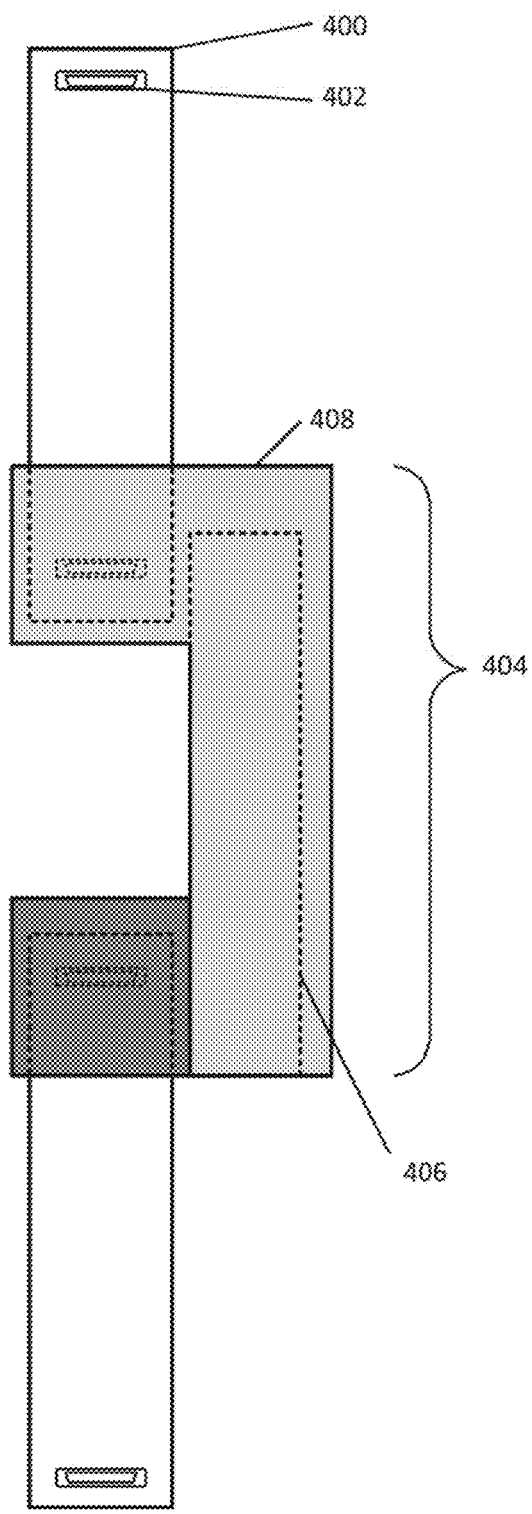

FIG. 4E makes portions of second connector bracket 408 translucent to expose internal portions of first connector bracket 406. The dashed lines in FIG. 4E represent features obscured by translucent portions of frame bridge 404. When frame bridge 404 is configured in the extended position, a portion of first connector bracket 406 is retained within second connector bracket 408. In some examples, first connector bracket 406 is slidably engaged to second connector bracket 408. For example, first connector bracket 406 may slide vertically in relation to second connector bracket 408.

In some examples, first connector bracket 406 includes a connector housing and a connector conduit and second connector bracket 408 includes a connector housing and a connector conduit. The connector conduit of first connector bracket 406 is retained within the connector conduit of second connector bracket 408. When frame bridge 404 is in the extended configuration, the connector conduit of first connector bracket 406 wholly resides in the connector conduit of second connector bracket 408 and no portion of the connector conduit of first connector bracket 406 is exposed.

Figure 4F:
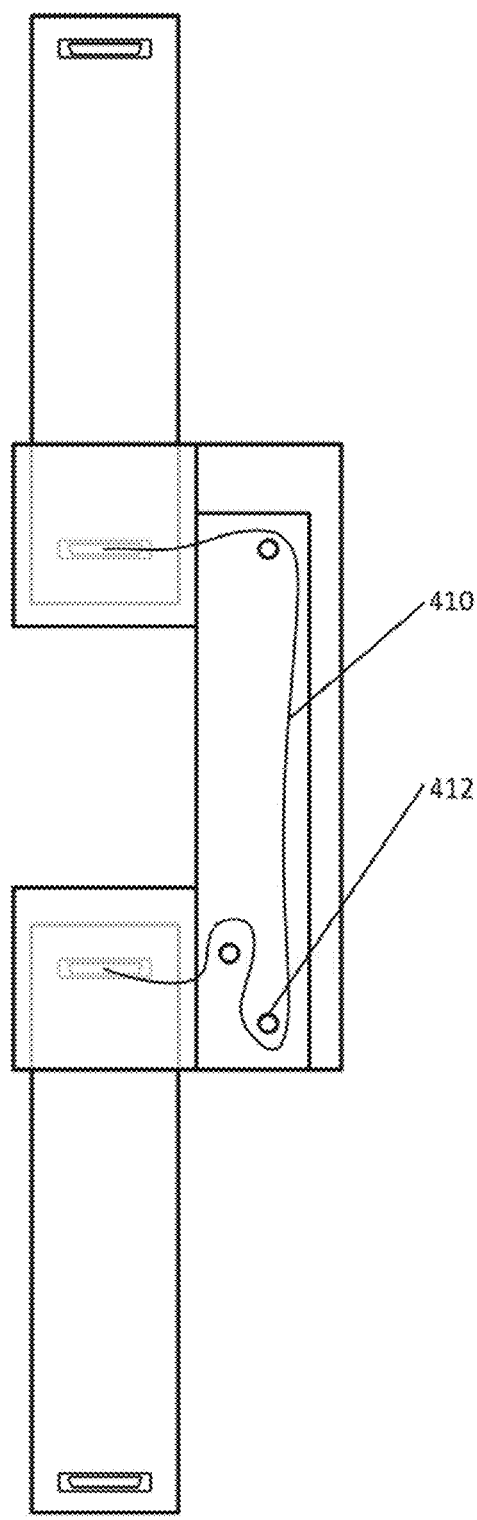
Figure 4G:
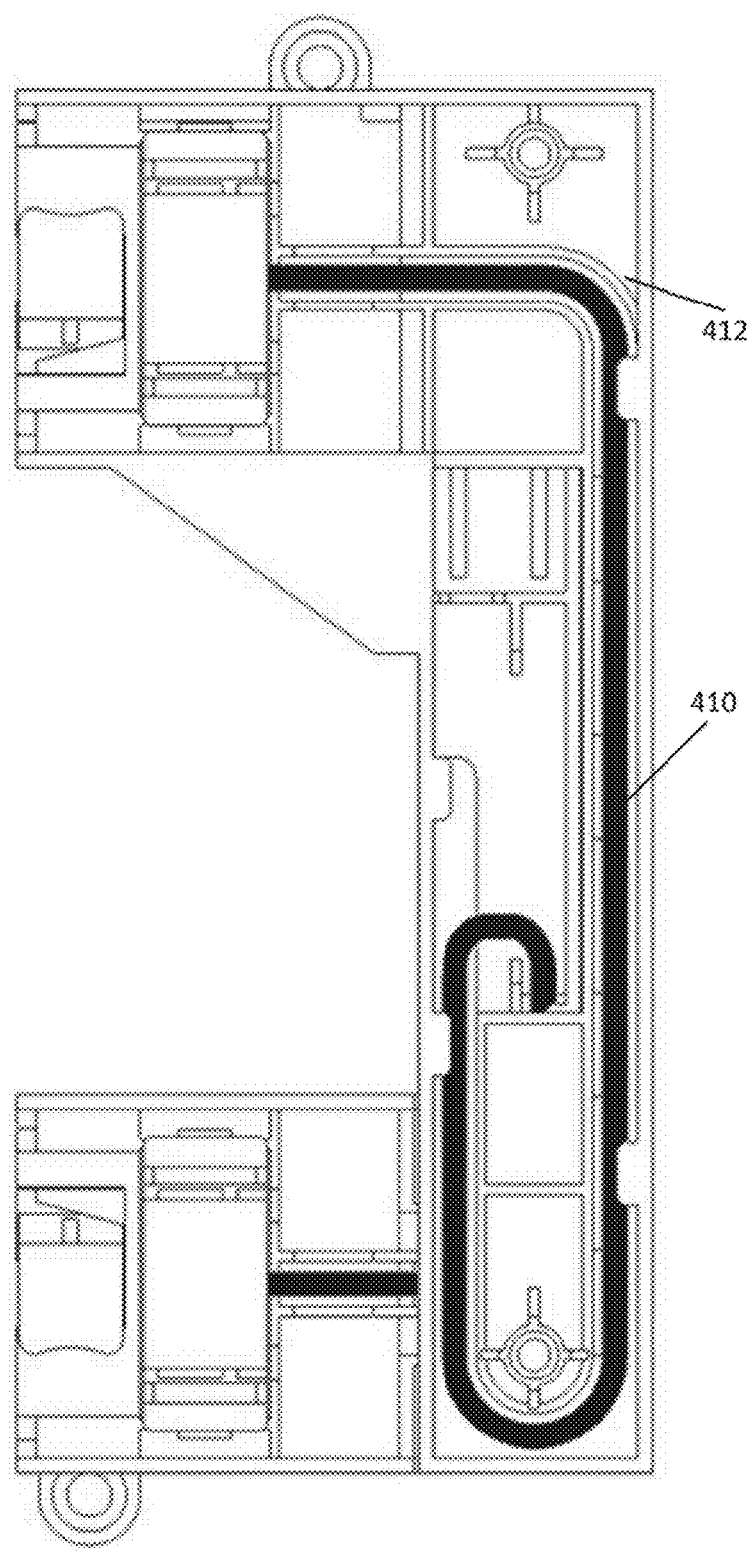

FIG. 4F makes the components of frame bridge 404 transparent. FIG. 4G is a detailed illustration of frame bridge 404 in an extended configuration with transparent external components. In FIGS. 4F-4G, like numerals refer to like features. The grey lines represent portions of frame shuffles 400 that are obscured by frame bridge 404. Frame bridge 404 contains a data connection 410 that interconnects lower terminal 402 of top frame shuffle 400 to top terminal 402 of lower frame shuffle 400. Portions of data connection 410 pass through a connector conduit of first connector bracket 406 and a connector conduit of second connector bracket 408. The portions of data connection 410 in the connector conduits move when frame bridge 404 is configured as extended or contracted. The portions of data connection 410 are restricted in movement by guides 412. In some examples, guides 412 are contained in the connector conduit of first connector bracket 406, the connector conduit of second connector bracket 408, or both. When frame bridge 404 is configured as extended or contracted, guides 412 may move in relation to one another or in relation to data connection 410. In certain configurations, data connection 410 may tightly conform to certain guides 412 and separate from certain other guides 412, whereas in certain other configurations, data connection 410 may tightly conform to all guides 412.

Figure 5A:
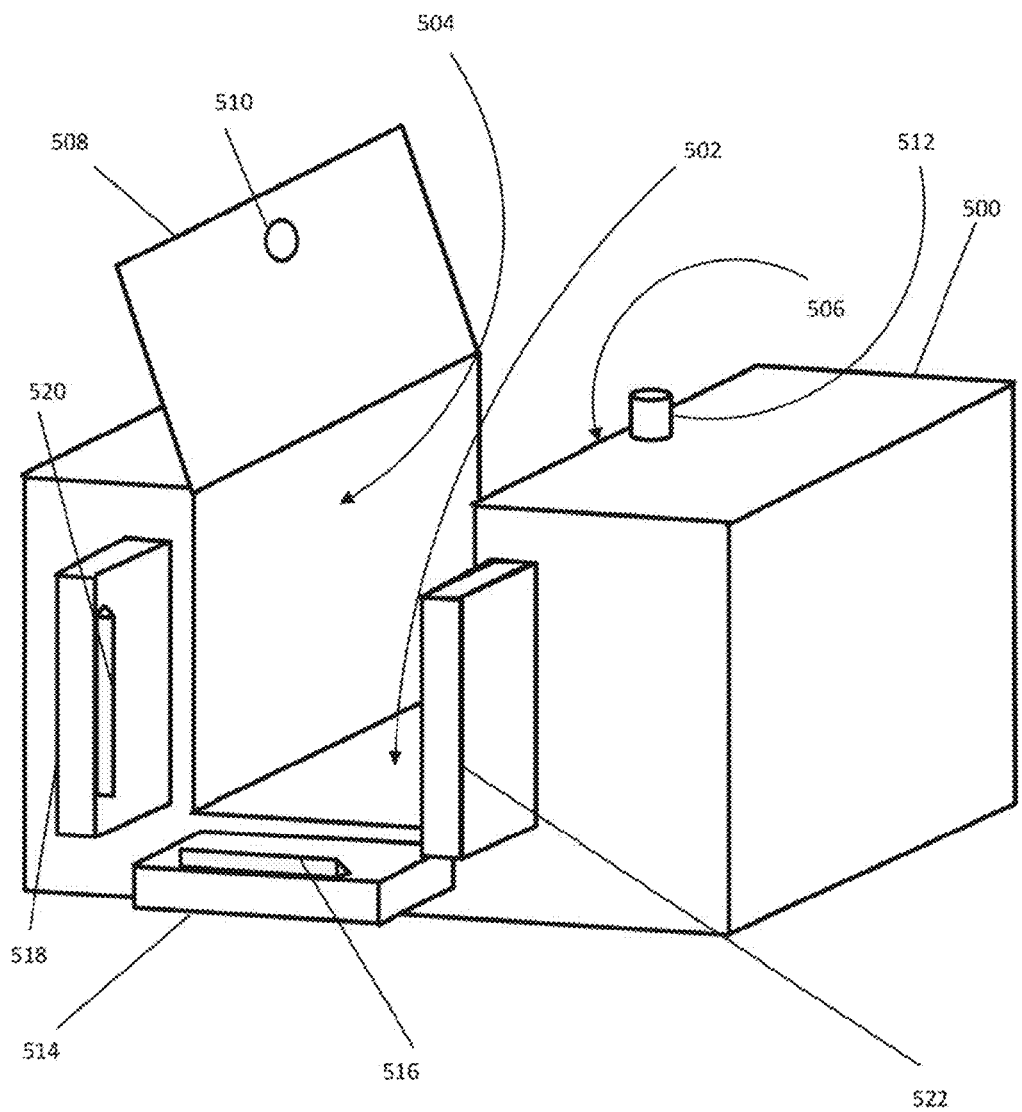
FIGS. 5A-5B illustrate an isometric view of an example rocker-arm plenum extender.
Figure 5B:
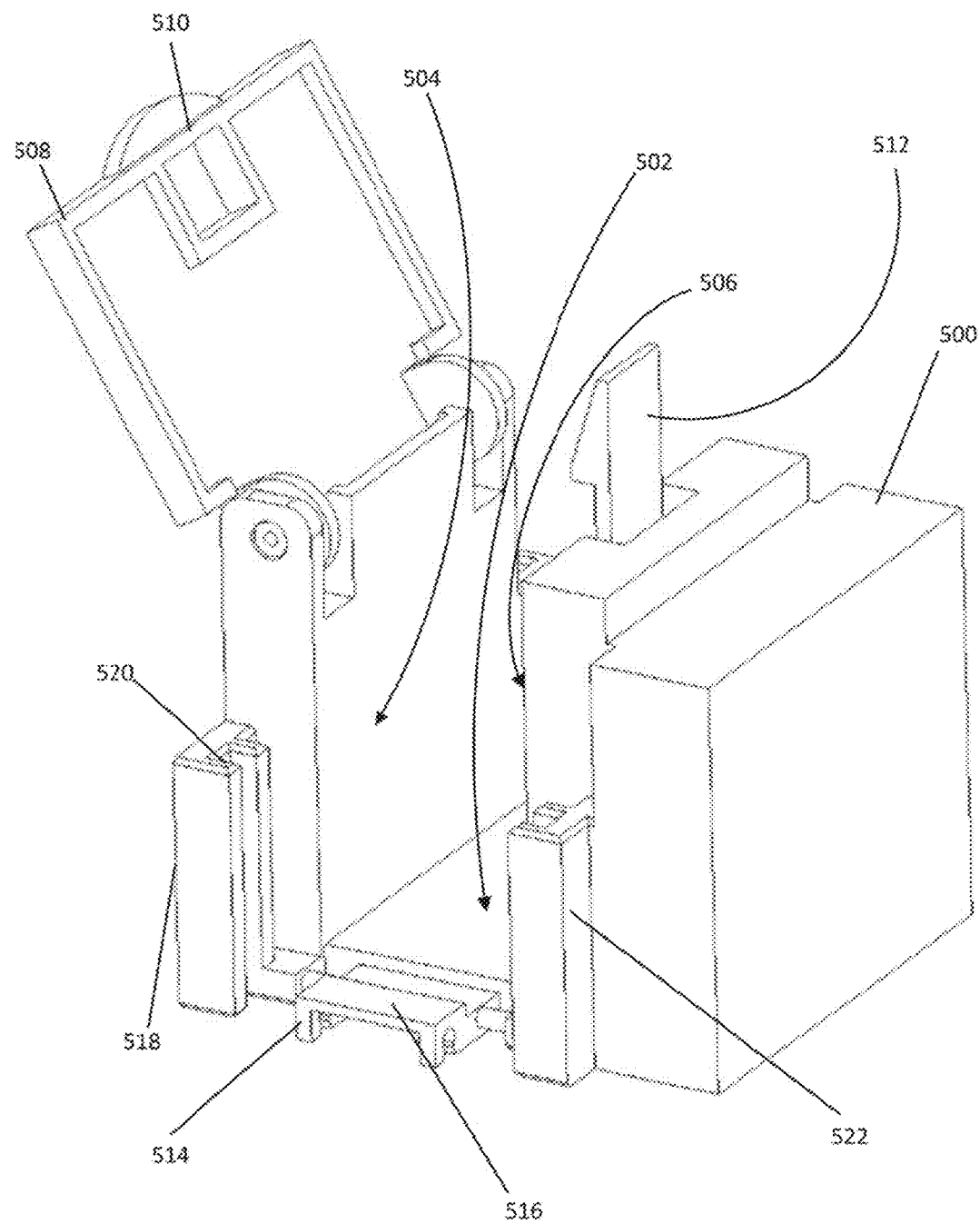

FIG. 5A illustrates an example rocker-arm plenum extender. FIG. 5B is a detailed illustration of an example rocker-arm plenum extender. In FIGS. 5A-5B, like numerals refer to like features. Rocker-arm plenum extender (or "plenum extender") 500 may be made of plastic or any other suitable material. In some examples, plenum extender 500 may be shaped to conform with the exterior surfaces of coupled rocker-arm plenums, resulting in a uniform appearance across coupled rocker-arm plenums. Although certain portions of plenum extender 500 appear in FIG. 5 to be solid, those portions may be solid, hollow, or partially filled in some examples, as appropriate. Plenum extender 500 includes a first surface 502. First surface 502 forms the bottom of a conduit trench. Plenum extender 500 further includes a second surface 504 and a third surface 506 (indicated but obscured in FIG. 5). Second surface 504 and third surface 506 are each orthogonal to first surface 502, and are parallel to one another, offset by a distance w.

Distance w represents the width of the conduit trench, as second surface 504 and third surface 506 define the sides of the conduit trench.

In some examples, a lid 508 is hingedly attached to plenum extender 500. Lid 508 is coupled to the top of second surface 504, wherein "top" refers to the edge of second surface 504 coupled to an imaginary surface bounding the conduit trench parallel to and opposite of first surface 502. Lid 508 (shown open in FIG. 5) may be opened to expose the conduit trench, and may be closed so that it spans the imaginary surface bounding the conduit trench. When closed, lid 508 couples to the top of second surface 504 and the top of third surface 506. Lid 508, when closed, is a distance h from first surface 502. Distance h represents the height of the conduit trench, as lid 508 and first surface 502 define the top and bottom of the conduit trench, respectively. Lid 508 includes a fastening mechanism 510. Fastening mechanism 510 interacts with fastening post 512 when lid 508 is closed to secure lid 508 in the closed position. Although FIG. 5 shows a peg and hole friction fastening system, any appropriate fastening system is contemplated.

Plenum extender 500 further includes a bottom protruding latch 514 at a first end of the conduit trench. An "end" of the conduit trench is defined by an imaginary surface that intersects first surface 502, second surface 504, and third surface 506 orthogonally at side edges of each surface. In some examples, bottom protruding latch 514 is substantially parallel to first surface 502. In certain examples, bottom protruding latch 514 is offset from the conduit trench by a distance, allowing another plenum extender or a rocker-arm plenum to couple to plenum extender 500 so that a surface is coplanar to first surface 502. For example, another plenum extender may be coupled to plenum extender 500 via bottom protruding latch 514, and a first surface of the other plenum extender would be positioned to extend the conduit trench with the first surface of the other plenum extender being coplanar with (or "flush with") first surface 502. Bottom protruding latch 514 contains barb 516. Barb 516 retains another plenum extender or a rocker-arm plenum that is coupled to plenum extender 500. For example, barb 516 may seat into a latch receiver of a rocker-arm plenum, resulting in plenum extender 500 being securely retained in a position in relation to the rocker-arm plenum. In some examples, barb 516 is a permanent retainer. In some other examples barb 516 allows plenum extender 500 to be decoupled if sufficient force is applied to barb 516 in an appropriate manner. Although bottom protruding latch 514 and barb 516 are shown in a certain configuration in FIG. 5, they may be configured in any appropriate manner for coupling and retaining plenum extender 500 in relative position to another plenum extender or a rocker-arm plenum.

In some examples, plenum extender 500 further includes a first side protruding latch 518 with barb 520 and a second side protruding latch 522 with a barb (not shown). First side protruding latch 518 is substantially parallel to second surface 504. In certain examples, first side protruding latch 518 is offset from the conduit trench by a distance, allowing another plenum extender or a rocker-arm plenum to couple to plenum extender 500 so that a surface is coplanar to second surface 504. For example, another plenum extender may be coupled to plenum extender 500 via first side protruding latch 518, and a second surface of the other plenum extender would be positioned to extend the conduit trench with the second surface of the other plenum extender being coplanar with (or "flush with") second surface 504. First side protruding latch 518 contains barb 520. Barb 520 retains another plenum extender or a rocker-arm plenum that is coupled to plenum extender 500. For example, barb 520 may seat into a latch receiver of a rocker-arm plenum, resulting in plenum extender 500 being securely retained in a position in relation to the rocker-arm plenum. In some examples, barb 520 is a permanent retainer. In some other examples barb 520 allows plenum extender 500 to be decoupled if sufficient force is applied to barb 520 in an appropriate manner. Although first side protruding latch 518 and barb 520 are shown in a certain configuration in FIG. 5, they may be configured in any appropriate manner for coupling and retaining plenum extender 500 in relative position to another plenum extender or a rocker-arm plenum.

Second side protruding latch 522 is substantially parallel to third surface 506. In certain examples, second side protruding latch 522 is offset from the conduit trench by a distance, allowing another plenum extender or a rocker-arm plenum to couple to plenum extender 500 so that a surface is coplanar to third surface 506. For example, another plenum extender may be coupled to plenum extender 500 via second side protruding latch 522, and a third surface of the other plenum extender would be positioned to extend the conduit trench with the third surface of the other plenum extender being coplanar with (or "flush with") third surface 506. Second side protruding latch 522 contains a barb (not shown). The barb retains another plenum extender or a rocker-arm plenum that is coupled to plenum extender 500. For example, the barb may seat into a latch receiver of a rocker-arm plenum, resulting in plenum extender 500 being securely retained in a position in relation to the rocker-arm plenum. In some examples, the barb is a permanent retainer. In some other examples, the barb allows plenum extender 500 to be decoupled if sufficient force is applied to the barb in an appropriate manner. Although second side protruding latch 522 is shown in a certain configuration in FIG. 5, it may be configured in any appropriate manner for coupling and retaining plenum extender 500 in relative position to another plenum extender or a rocker-arm plenum.

Figure 6A:
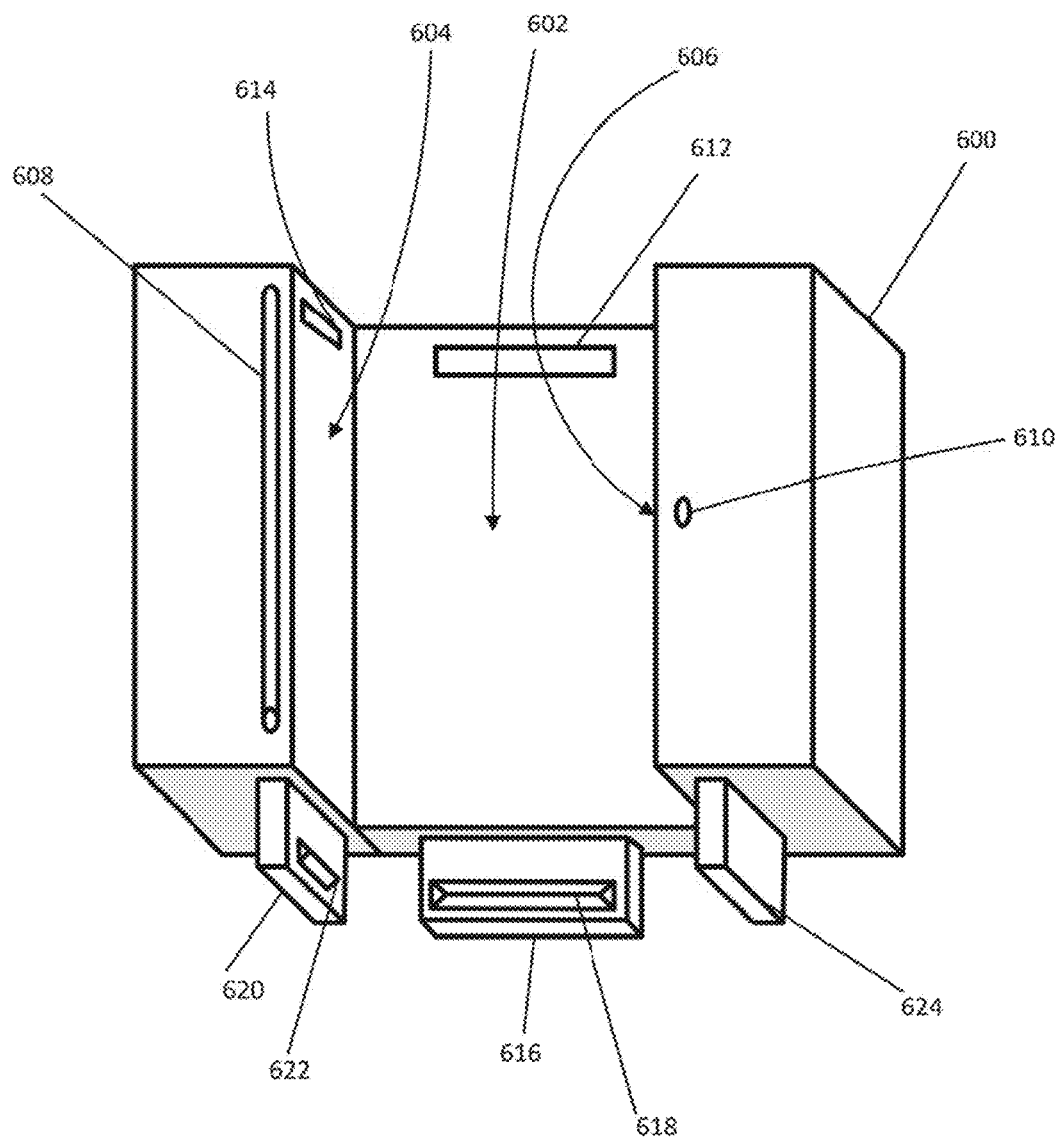
FIGS. 6A-6B illustrate a top view of an example rocker-arm plenum extender.
Figure 6B:
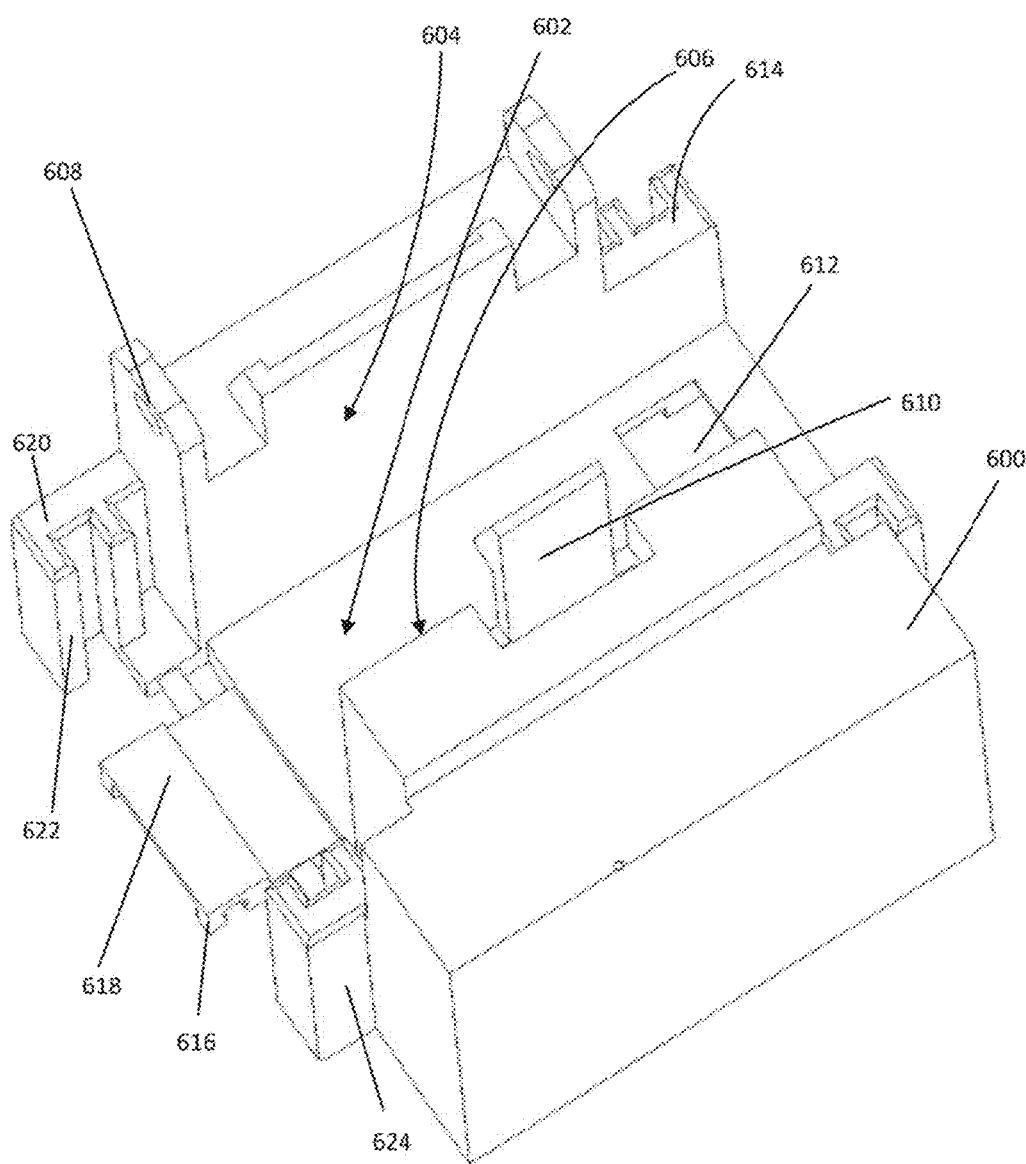

FIG. 6A illustrates a top view of an example rocker-arm plenum extender. FIG. 6B is a detailed illustration of a top view of an example rocker-arm plenum extender. In FIGS. 6A-6B, like numerals refer to like features. Rocker-arm plenum extender (or "plenum extender") 600 may be made of plastic or any other suitable material. In some examples, plenum extender 600 may be shaped to conform with the exterior surfaces of coupled rocker-arm plenums, resulting in a uniform appearance across coupled rocker-arm plenums. Although certain portions of plenum extender 600 appear in FIG. 6 to be solid, those portions may be solid, hollow, or partially filled in some examples, as appropriate. Plenum extender 600 includes a first surface 602. First surface 602 forms the bottom of a conduit trench. Plenum extender 600 further includes a second surface 604 and a third surface 606 (indicated but obscured in FIG. 6). Second surface 604 and third surface 606 are each orthogonal to first surface 602, and are parallel to one another, offset by a distance w. Distance w represents the width of the conduit trench, as second surface 604 and third surface 606 define the sides of the conduit trench.

In some examples, a lid (not shown) is attached by a hinge 608 to plenum extender 600. Hinge 608 is coupled to the top of second surface 604, wherein "top" refers to the edge of second surface 604 coupled to an imaginary surface bounding the conduit trench parallel to and opposite of first surface 602. The lid may be opened by rotating about hinge 608 to expose the conduit trench, and may be closed so that it spans the imaginary surface bounding the conduit trench. When closed, the lid couples to the top of second surface 604 and the top of third surface 606 via fastening post 610. The lid includes a fastening mechanism (not shown). The fastening mechanism interacts with fastening post 610 when the lid is closed to secure the lid in the closed position. Although FIG. 6 shows a peg fastening post, any appropriate fastening system is contemplated.

Plenum extender 600 further includes a bottom latch receiver 612, a first side latch receiver 614, and a second side latch receiver (not shown) near a first end of the conduit trench. An "end" of the conduit trench is defined by an imaginary surface that intersects first surface 602, second surface 604, and third surface 606 orthogonally at side edges of each surface. Bottom latch receiver 612 may be coupled to and parallel to first surface 602. First side latch receiver 614 may be coupled to and parallel to second surface 604. The second side latch receiver may be coupled to and parallel to third surface 606. The latch receivers secure plenum extender 600 to another plenum extender or a rocker-arm plenum with complementary protruding latches. In some examples of FIG. 6, the latch receivers of plenum extender 600 include slots to receive barbs of protruding latches, which couples plenum extender 600 to another plenum extender or a rocker-arm plenum.

Plenum extender 600 also includes a bottom protruding latch 616 at a second end of the conduit trench. An "end" of the conduit trench is defined by an imaginary surface that intersects first surface 602, second surface 604, and third surface 606 orthogonally at side edges of each surface. In some examples, bottom protruding latch 616 is substantially parallel to first surface 602. In certain examples, bottom protruding latch 616 is offset from the conduit trench by a distance, allowing another plenum extender or a rocker-arm plenum to couple to plenum extender 600 so that a surface is coplanar to first surface 602. For example, another plenum extender may be coupled to plenum extender 600 via bottom protruding latch 616, and a first surface of the other plenum extender would be positioned to extend the conduit trench with the first surface of the other plenum extender being coplanar with (or "flush with") first surface 602. Bottom protruding latch 616 contains barb 618. Barb 618 retains another plenum extender or a rocker-arm plenum that is coupled to plenum extender 600. For example, barb 618 may seat into a latch receiver of a rocker-arm plenum, resulting in plenum extender 600 being securely retained in a position in relation to the rocker-arm plenum. In some examples, barb 618 is a permanent retainer. In some other examples barb 618 allows plenum extender 600 to be decoupled if sufficient force is applied to barb 618 in an appropriate manner. Although bottom protruding latch 616 and barb 618 are shown in a certain configuration in FIG. 6, they may be configured in any appropriate manner for coupling and retaining plenum extender 600 in relative position to another plenum extender or a rocker-arm plenum.

In some examples, plenum extender 600 further includes a first side protruding latch 620 with barb 622 and a second side protruding latch 624 with a barb (not shown). First side protruding latch 620 is substantially parallel to second surface 604. In certain examples, first side protruding latch 620 is offset from the conduit trench by a distance, allowing another plenum extender or a rocker-arm plenum to couple to plenum extender 600 so that a surface is coplanar to second surface 604. For example, another plenum extender may be coupled to plenum extender 600 via first side protruding latch 620, and a second surface of the other plenum extender would be positioned to extend the conduit trench with the second surface of the other plenum extender being coplanar with (or "flush with") second surface 604. First side protruding latch 620 contains barb 622. Barb 622 retains another plenum extender or a rocker-arm plenum that is coupled to plenum extender 600. For example, barb 622 may seat into a latch receiver of a rocker-arm plenum, resulting in plenum extender 600 being securely retained in a position in relation to the rocker-arm plenum. In some examples, barb 622 is a permanent retainer. In some other examples barb 622 allows plenum extender 600 to be decoupled if sufficient force is applied to barb 622 in an appropriate manner. Although first side protruding latch 620 and barb 622 are shown in a certain configuration in FIG. 6, they may be configured in any appropriate manner for coupling and retaining plenum extender 600 in relative position to another plenum extender or a rocker-arm plenum.

Second side protruding latch 624 is substantially parallel to third surface 606. In certain examples, second side protruding latch 624 is offset from the conduit trench by a distance, allowing another plenum extender or a rocker-arm plenum to couple to plenum extender 600 so that a surface is coplanar to third surface 606. For example, another plenum extender may be coupled to plenum extender 600 via second side protruding latch 624, and a third surface of the other plenum extender would be positioned to extend the conduit trench with the third surface of the other plenum extender being coplanar with (or "flush with") third surface 606. Second side protruding latch 624 contains a barb (not shown). The barb retains another plenum extender or a rocker-arm plenum that is coupled to plenum extender 600. For example, the barb may seat into a latch receiver of a rocker-arm plenum, resulting in plenum extender 600 being securely retained in a position in relation to the rocker-arm plenum. In some examples, the barb is a permanent retainer. In some other examples, the barb allows plenum extender 600 to be decoupled if sufficient force is applied to the barb in an appropriate manner. Although second side protruding latch 624 is shown in a certain configuration in FIG. 6, it may be configured in any appropriate manner for coupling and retaining plenum extender 600 in relative position to another plenum extender or a rocker-arm plenum.

FIG. 7 illustrate rocker-arm plenums coupling and coupled to one another. In FIG. 7, racks, frames and other network apparatus are omitted in favor of clarity. Only one of each component is labeled in the interest of clarity. In FIG. 7, dashed arrows indicate motion. In FIG. 7, like numerals refer to like features.

Figure 7A:
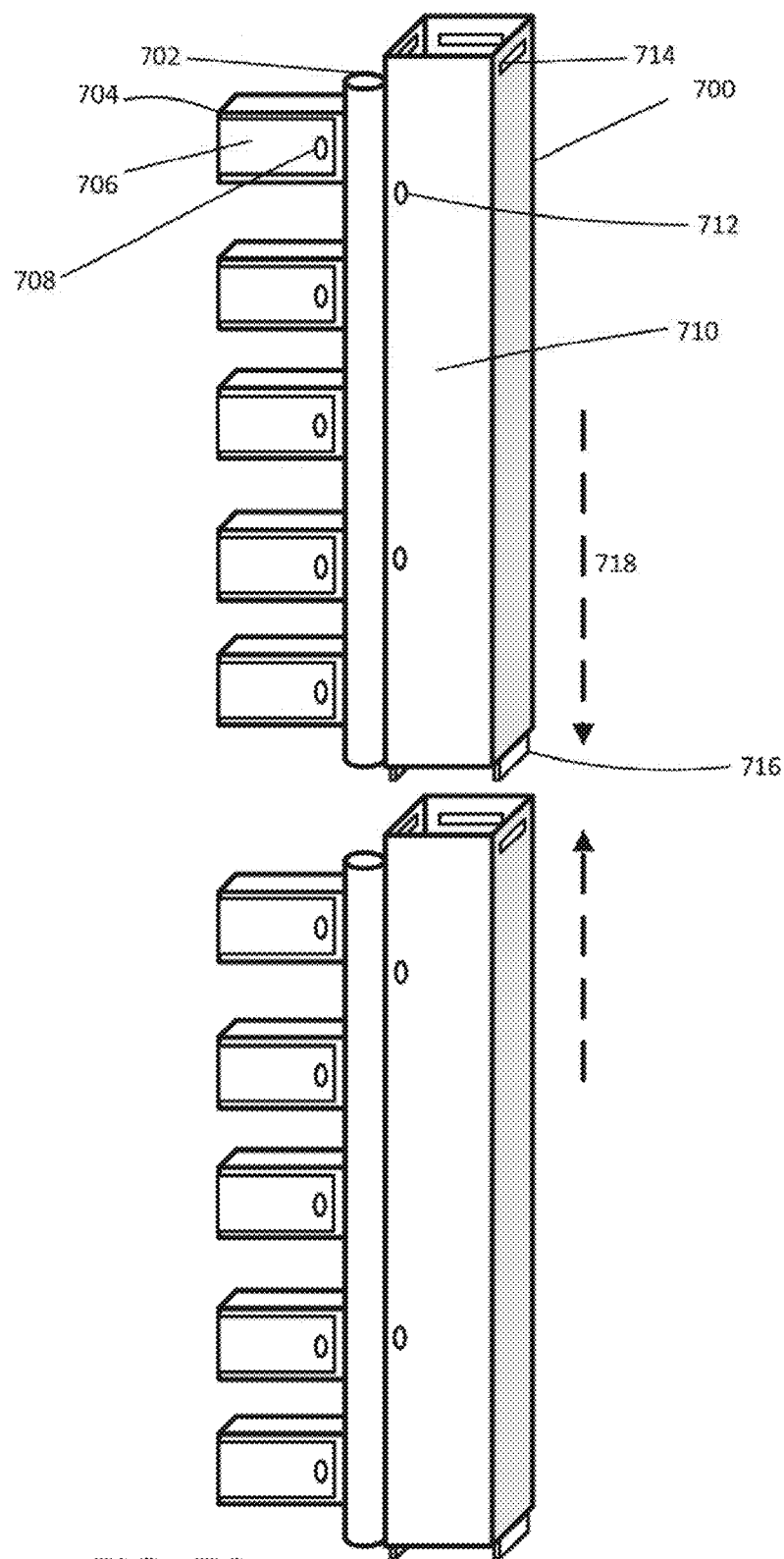
FIGS. 7A-7E illustrate example interconnected rocker-arm plenums.

FIG. 7A illustrates example rocker-arm plenums directly coupling to one another. Rocker-arm plenums 700 include a main body with rocker arms 704 attached via a hinge 702. The main body may be a conduit trench, similar in dimension to the conduit trenches of plenum extenders 500 and 600. Rocker arms 704 are spaced along hinge 702 at a distance determined based on the design of a frame in a rack. Rocker arms 704 have terminals and rocker arms 704 are positioned such that when rocked closed, the terminals couple with complementary terminals of corresponding resource modules of the frame. Rocker arms 704 are position such that when rocked open, the corresponding resource modules can be inserted, reconfigured, and removed. In some examples, rocker arms 704 include lids 706 that open to expose a data connection and a terminal seated in the rocker arm. Lids 706 include fasteners 708 that retain lids 706 in the closed position.

The main bodies of rocker-arm plenums 700 include lids 710 that, when open, allow access to a cable harness including data connections. In some examples, the cable harness includes bundles of optical fibers. Lids 710 contain fasteners 712 that retain lids 710 in a closed position. The main bodies of rocker-arm plenums 700 further contain latch receivers 714 at one end of the main bodies and protruding latches 716 at the other end of the main bodies. Similar to plenum extenders 500 and 600, rocker-arm plenums 700 may include three latch receivers 714 and three complementary protruding latches 716 to couple rocker-arm plenums 700 to one another so that interior surfaces of the main bodies are coplanar with ("flush with") one another, extending the conduit trench of the rocker-arm plenums 700.

In some examples of FIG. 7A, top rocker-arm plenum 700 corresponds to a first frame, and bottom rocker-arm plenum 700 corresponds to a second frame adjacent to the first frame. Since the frames are adjacent, no plenum extender is required between rocker-arm plenums 700, so the rocker-arm plenums 700 directly interconnect 718.

Figure 7B:
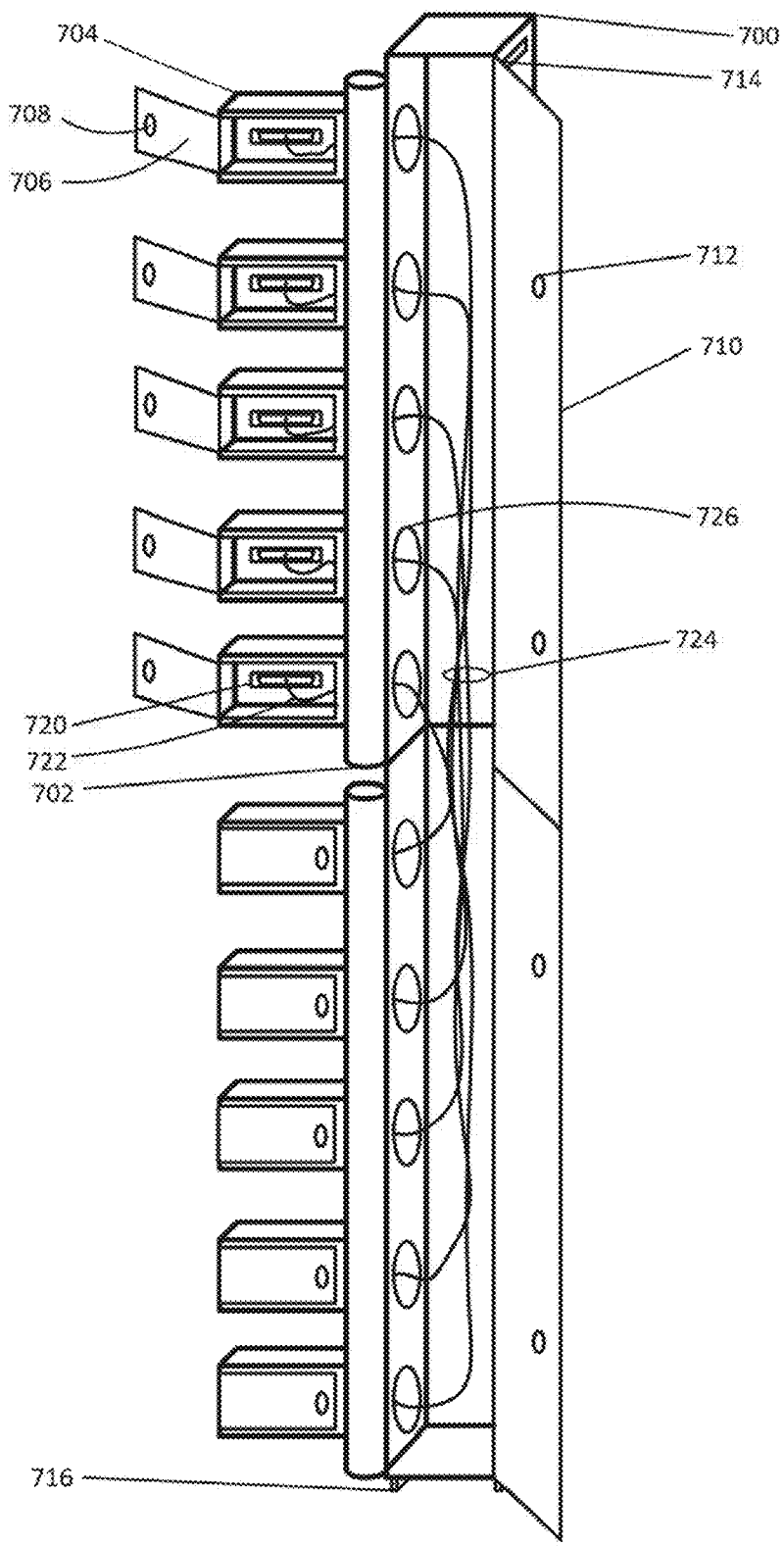

FIG. 7B illustrates rocker-arm plenums 700 interconnected to one another. In some examples, rocker-arm plenums 700 illustrated in FIG. 7B correspond to adjacent frames. Rocker arms 704 include terminals 720. In some examples, terminals 720 are components of data connections 722 and terminals 720 are seated in rocker arms 704. In some other examples, terminals 720 couple to data connections 722. Data connections 722 pass into the conduit trench of the rocker-arm plenums 700 to cable harness 724. Data connections 722 pass through rocker arm entry 726. Although rocker arm entry 726 is illustrated in FIG. 7B as a hole, rocker arm entry 726 is also contemplated by this disclosure to be a trench or any other passage appropriate for receiving data connections 722. In some examples, rocker arm entry 726 is large enough that a terminal 720 may pass through rocker arm entry 726. In some examples, data connections 722 include a bundle of optical fibers. The bundle of optical fibers couple to terminal 720, pass through rocker arm 704 and through rocker arm entry 726 to the main body of rocker-arm plenum 700 where optical fibers are routed to their appropriate destination terminals 720.

Figure 7C:
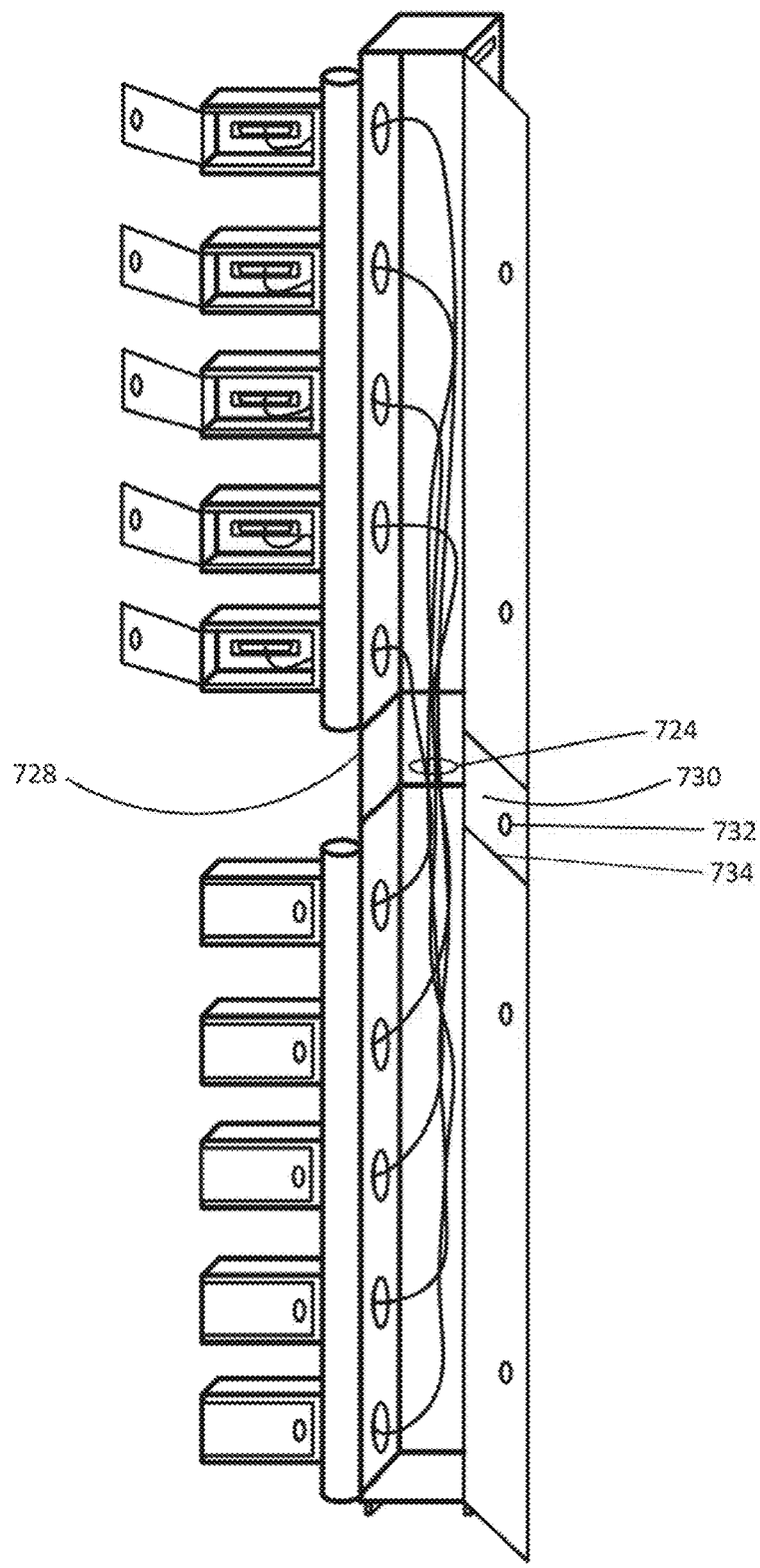

FIG. 7C illustrates rocker-arm plenums 700 interconnected to one another via plenum extender 728. In some examples, rocker-arm plenums 700 illustrated in FIG. 7C correspond to successive frames with a one (1) rack unit air gap separating them. With plenum extender 728 coupled to rocker-arm plenums 700, cable harness 724 passes through plenum extender 728, providing interconnections between resource modules of the successive frames. Plenum extender 728 includes a lid 730, which includes a fastener 732 that retains lid 730 in a closed position. Lid 730 may couple 734 with lids 710 of rocker-arm plenums 700 so that lid 730 and lids 710 operate as a single lid, opening and closing in tandem.

Figure 7D:
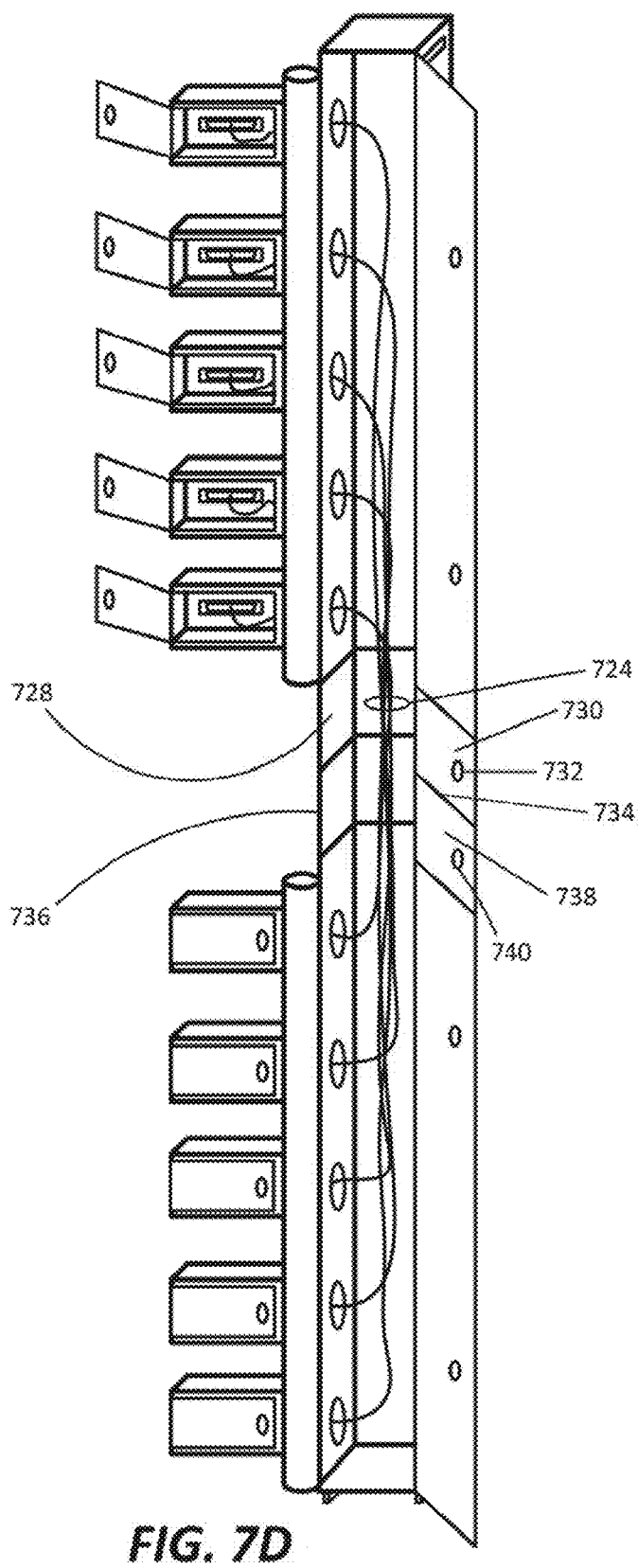
Figure 7E:
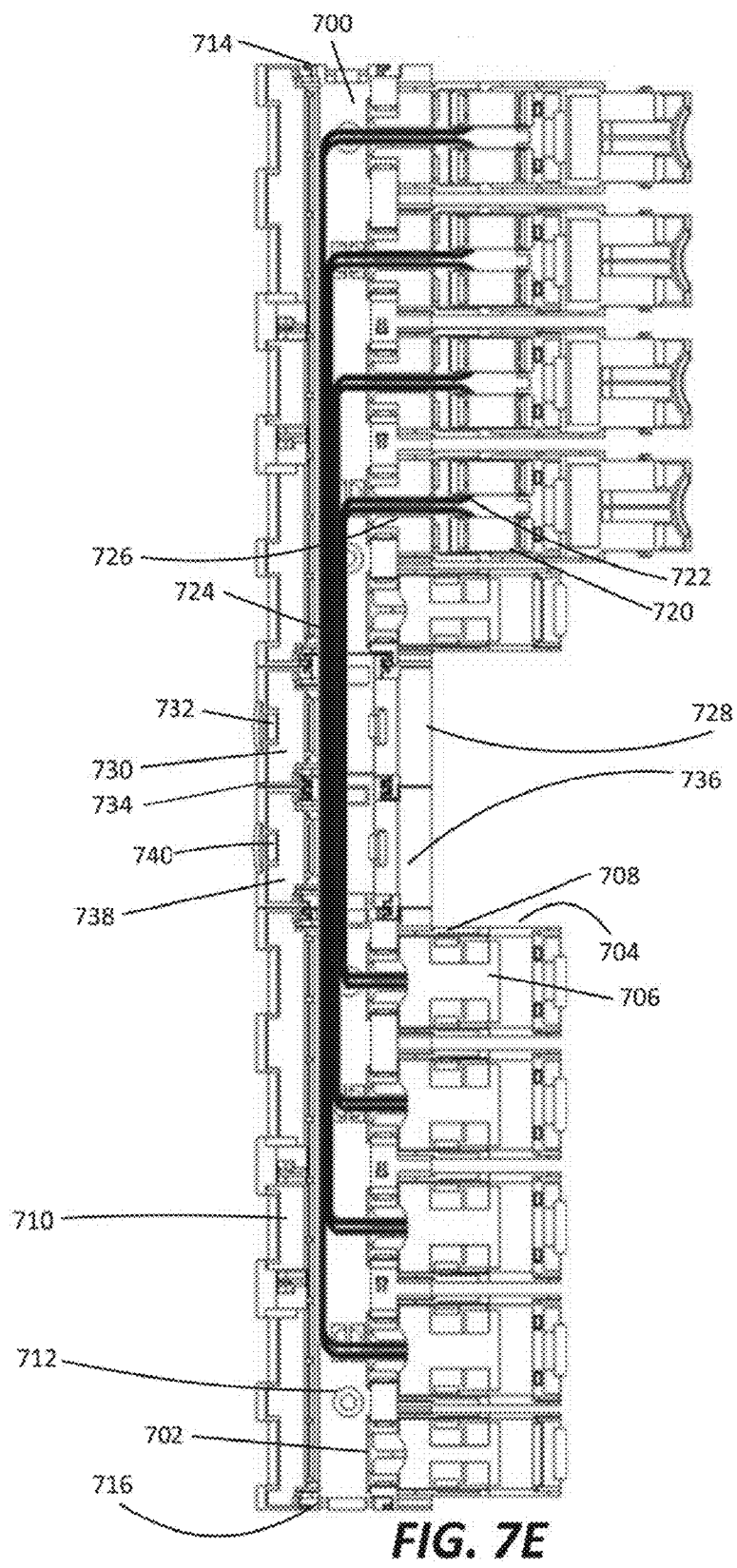

FIG. 7D illustrates rocker-arm plenums 700 interconnected to one another via plenum extenders 728 and 736. FIG. 7E is a detailed illustration of example rocker-arm plenums 700 interconnect to one another via plenum extenders. In some examples, rocker-arm plenums 700 illustrated in FIG. 7D correspond to successive frames with a two (2) rack unit air gap separating them. With plenum extenders 728 and 736 coupled between rocker-arm plenums 700, cable harness 724 passes through plenum extenders 728 and 736, providing interconnections between resource modules of the successive frames. Plenum extenders 728 and 736 include lids 730 and 738, which include fasteners 732 and 740 that retain lids 730 and 738 in a closed position. Lids 730 and 738 may couple 734 with one another and with lids 710 of rocker-arm plenums 700 so that lids 710, 730, and 738 operate as a single lid, opening and closing in tandem.

FIG. 8 illustrate a rear view of a rack with successive frames showing rocker-arm plenums installed on the rack.

Rack 800 may be designed based on standard widths and depths as appropriate. In some examples, rack 800 is tall enough to accommodate multiple frames and air gaps between certain frames. Rack 800 includes a frame that supports the weight of attached devices and a mounting apparatus 802. Mounting apparatus 802 is coupled to the frame so that it restrains mounted devices relative to the frame. For example, mounting apparatus 802 may be Radio Electronics Television Manufacturers Association (RETMA) rails. In some examples, mounting apparatus 802 include mount points 804 (represented by holes in FIG. 8A). Mount points 804 may be holes that accept a bolt or screw, or mount points 804 may be any appropriate mechanism for mounting frames 806 to rack 800.

Mount points 804 are interspersed along mounting apparatus 802 by a one (1) rack unit separation. This separation allows frames 806 and other rack devices, which may be dimensioned to heights that are multiples of one rack unit, to be efficiently stacked within rack 800. Frames 806 are coupled to mounting apparatus 802 at mount points 808. Frames 806 may be coupled in the front of rack 800, in the back of rack 800, or both. Although the examples of FIG. 8A disclose a phillips-head bolt securing frames 806 to mounting apparatus 802, this disclosure contemplates any appropriate fastening mechanism that retains frames 806 in relation to rack 800. Frames 806 contain resource modules 810 which may be compute modules, storage modules, or fabric modules. It may be preferable to separate certain devices and frames 806 by an air gap 812 based on a network design. For example, air gap 812, as shown in FIG. 8A is a two (2) rack unit air gap.

Resource modules 810 include terminals 814 for interconnecting with other resource modules. In some examples, terminals 814 facing the rear of rack 800 are high bandwidth terminals. For example, terminals 814 may interconnect to other resource modules 810 via a bundle of optical fibers capable of 100 Gigabits per second communication bandwidth or greater. Rocker-arm plenums 816 may be mounted to mounting apparatus 802 and each correspond to a frame 806. In some examples, rocker-arm plenums 816 are mounted to mounting apparatus 802 through brackets that position and align rocker-arm plenums 816 relative to resource modules 810. Rocker-arm plenums 816 are mounted so that each rocker arm of rocker-arm plenum 816 can, when rocked to a closed position, couple with a terminal 814 of a resource module 810 of the corresponding frame 806. As shown in FIG. 8A, rocker-arm plenums 816 contain rocker arms corresponding to each resource module 810 of the corresponding frame 806.

Figure 8A:
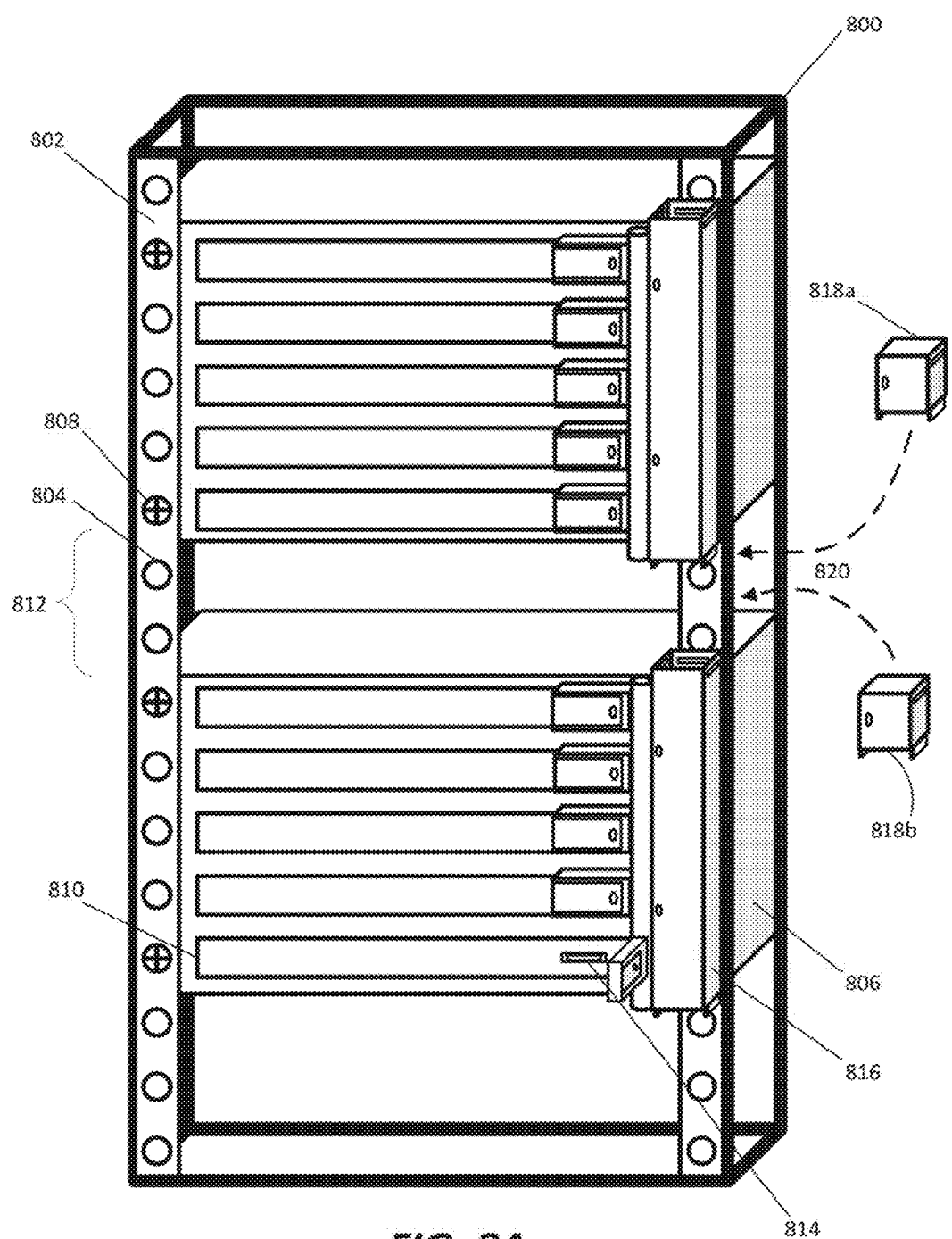
FIGS. 8A-8C illustrate an example rack containing frames coupled through interconnected rocker-arm plenums.

In the examples of FIG. 8A, the two (2) rack unit air gap 812 corresponds with a two (2) rack unit separation between top rocker-arm plenum 816 and bottom rocker-arm plenum 816. Since rocker-arm plenums 816 are used, in part, to conceal the cable harness from exposure to the outside, such a separation is not preferred. In order to bridge the separation and to extend the conduit trench, plenum extenders 818 are inserted and coupled 820 between rocker-arm plenums 816. Since a two (2) rack unit separation exists between rocker-arm plenums 816, a pair of one (1) rack unit height plenum extenders 818a and 818b are coupled between rocker-arm plenums 816. Plenum extender 818a couples to the bottom of top rocker-arm plenum 816 and to the top of plenum extender 818b. Plenum extender 818b coupled to the bottom of plenum extender 818a and to the top of bottom rocker-arm plenum 816. Alternatively, in another example, a single two (2) rack unit height plenum extender 818 may be used in place of plenum extenders 818a and 818b.

Figure 8B:
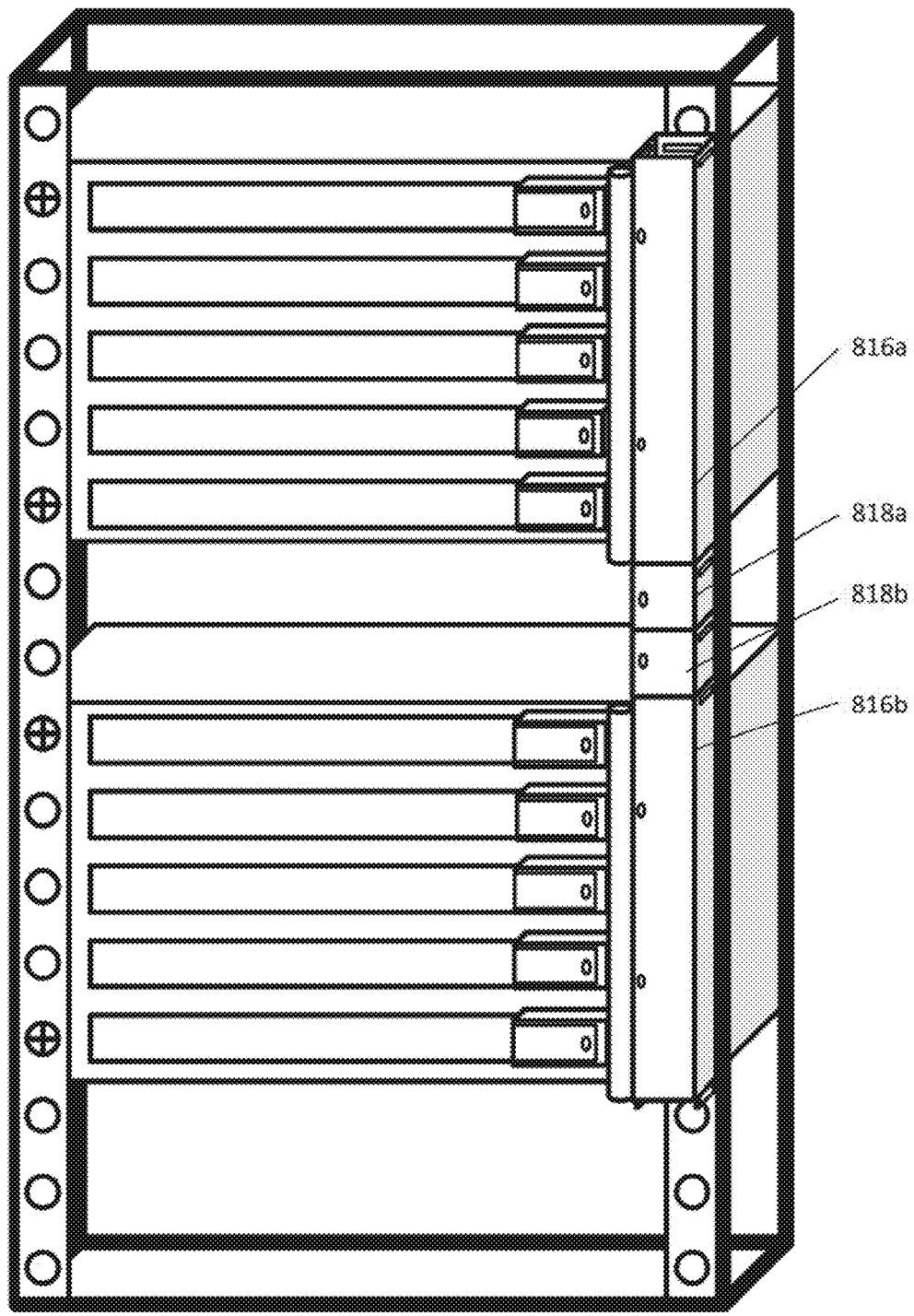
Figure 8C:
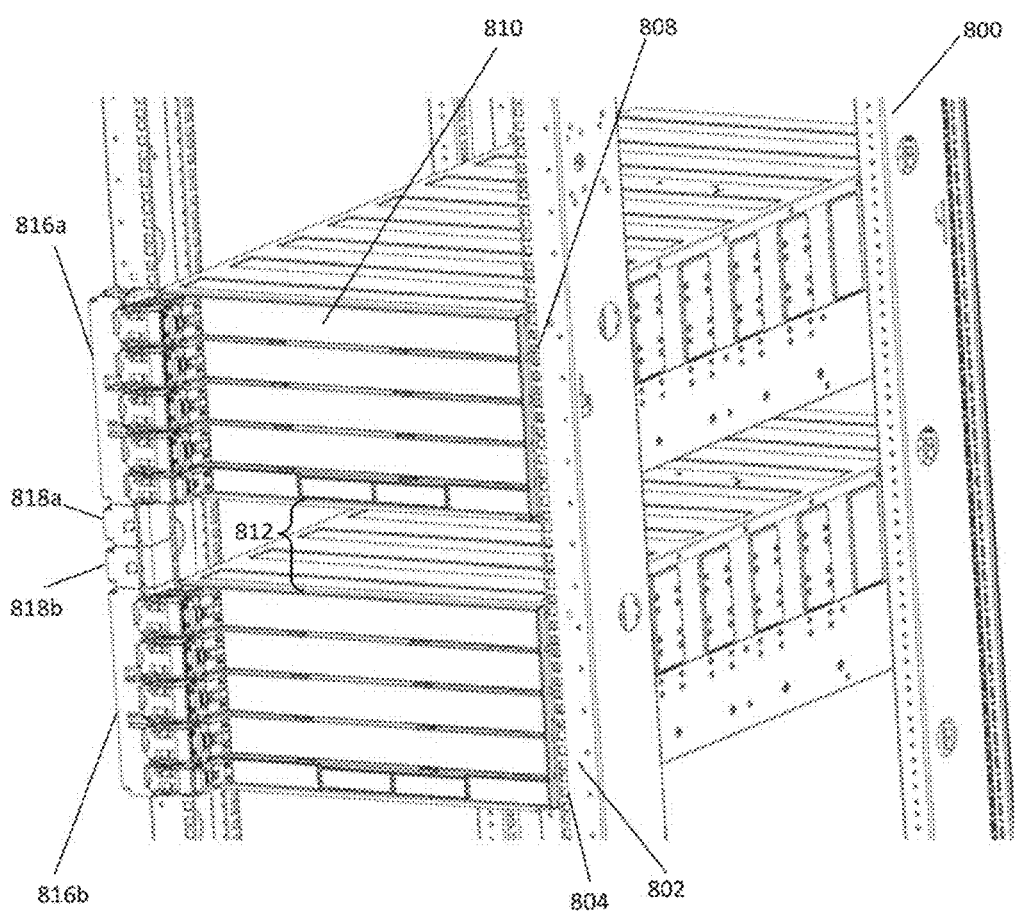

FIG. 8B shows the rack of FIG. 8A with rocker-arm plenums interconnected by plenum extenders. FIG. 8C is a detailed illustration of an example rack with rocker-arm plenums interconnected by plenum extenders. In FIG. 8, like numerals refer to like features. In accordance with the aforementioned insertion and coupling 820 of plenum extenders 818, FIGS. 8B-8C illustrate top rocker-arm plenum 816a coupled to top plenum extender 818a, which is, in turn, coupled to bottom plenum extender 818b, which is also coupled to bottom rocker-arm plenum 816b. These coupling extend and interconnect the conduit trenches of each respective rocker-arm plenum 816 and plenum extender 818, resulting in an extended conduit trench along the edge of rack 800. As can be understood from this disclosure, there is no limit to the number of rocker-arm plenums 816 and plenum extenders 818 that can be coupled together, except as limited by the height of rack 800 and the number of frames 806 mounted in rack 800.

Although the present disclosure has been described in detail, it should be understood that various changes, substitutions and alterations can be made without departing from the spirit and scope of the disclosure. Any use of the words "may" or "can" in respect to features of the disclosure indicates that certain embodiments include the feature and certain other embodiments do not include the feature, as is appropriate given the context. Any use of the words "or" and "and" in respect to features of the disclosure indicates that embodiments can contain any combination of the listed features, as is appropriate given the context.

The invention claimed is:

1. A plenum extender, comprising:
   a first interior surface;
   a second interior surface orthogonal to the first interior surface;
   a third interior surface parallel to the second interior surface, the third interior surface offset from the second interior surface by a distance w, wherein the first interior surface, the second interior surface, and the third interior surface define a conduit trench of width w;
   a lid hinged to the second interior surface that, when coupled to the third interior surface, is parallel to the first interior surface and offset from the first interior surface by a distance h, wherein the conduit trench is of height h;
   a first protruding latch to mate with one of: a first rocker-arm plenum and another plenum extender, wherein the first protruding latch is coupled to the first interior surface, wherein the first protruding latch is arranged in parallel with the first interior surface at a first end of the conduit trench; and
   a first latch receiver to receive a protruding latch of one of: a second rocker-arm plenum and another plenum extender, wherein the latch receiver is coupled to the first interior surface and arranged in parallel with the first interior surface at a second end of the conduit trench.

2. The plenum extender of claim 1, further comprising a second protruding latch and a third protruding latch, wherein the second protruding latch is coupled to the second interior surface and arranged in parallel with the second interior surface at the first end of the conduit trench, and wherein the third protruding latch is coupled to the third interior surface and arranged in parallel with the third interior surface at the first end of the conduit trench.

3. The plenum extender of claim 2, wherein the first protruding latch, the second protruding latch, and the third protruding latch are each mated to a first plenum latch receiver, a second plenum latch receiver, and a third plenum latch receiver of the first rocker-arm plenum, respectively.

4. The plenum extender of claim 2, further comprising a second latch receiver to receive a protruding latch and a third latch receiver to receive a protruding latch, wherein the second latch receiver is coupled to the second interior surface and arranged in parallel with the second interior surface at the second end of the conduit trench, and wherein the third latch receiver is coupled to the third interior surface and arranged in parallel with the third interior surface at the second end of the conduit trench.

5. The plenum extender of claim 4, wherein the first latch receiver, the second latch receiver, and the third latch receiver are each mated to a first plenum latch, a second plenum latch, and a third plenum latch of the second rocker-arm plenum, respectively.

6. The plenum extender of claim 1, wherein a portion of a cable harness is located within the conduit trench, and wherein the cable harness communicatively couples the first rocker-arm plenum to the second rocker-arm plenum, and wherein portions of the cable harness are located within a first trench of the first rocker-arm plenum and a second trench of the second rocker-arm plenum, respectively.

7. The plenum extender of claim 1, wherein the first rocker-arm plenum is separated from the second rocker-arm plenum by one rack unit, and wherein the plenum extender is coupled to the first rocker-arm plenum and the second rocker-arm plenum.

8. The plenum extender of claim 1, wherein the first and second rocker-arm plenums interconnect frames of a rack through a high-bandwidth fabric.

* * * * *